(12) United States Patent
Matsunaga et al.

(10) Patent No.: US 7,989,964 B2
(45) Date of Patent: Aug. 2, 2011

(54) SEMICONDUCTOR INTEGRATED CIRCUIT

(75) Inventors: Hiroki Matsunaga, Osaka (JP); Akihiro Maejima, Osaka (JP); Jinsaku Kaneda, Osaka (JP); Hiroshi Ando, Osaka (JP); Eisaku Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 468 days.

(21) Appl. No.: 12/094,494

(22) PCT Filed: Sep. 29, 2006

(86) PCT No.: PCT/JP2006/319535
§ 371 (c)(1),
(2), (4) Date: May 21, 2008

(87) PCT Pub. No.: WO2007/099664
PCT Pub. Date: Sep. 7, 2007

(65) Prior Publication Data
US 2009/0273099 A1  Nov. 5, 2009

(30) Foreign Application Priority Data
Mar. 2, 2006  (JP) ................................ 2006-056575

(51) Int. Cl.
*H01L 23/52* (2006.01)
*H01L 23/48* (2006.01)
*H01L 29/40* (2006.01)

(52) U.S. Cl. ................ 257/786; 257/E21.503; 257/773; 257/776

(58) Field of Classification Search ........... 257/E25.029, 257/E21.503, E21.511, E23.079, 786, 784, 257/738, 730, 773, 775, 776, 674, 691, 696, 698; 29/827
See application file for complete search history.

(56) References Cited

U.S. PATENT DOCUMENTS

| 6,602,733 B2 * | 8/2003 | Iwahashi et al. ............. 438/108 |
| 6,870,779 B2 * | 3/2005 | Kang ....................... 365/189.11 |
| 2003/0193088 A1 * | 10/2003 | Hall et al. ..................... 257/713 |
| 2004/0000726 A1 * | 1/2004 | Lee et al. ...................... 257/784 |
| 2004/0217425 A1 | 11/2004 | Brodsky et al. |
| 2005/0134533 A1 | 6/2005 | Sasada et al. |
| 2005/0258866 A1 * | 11/2005 | Mandegaran et al. .......... 326/82 |
| 2009/0045480 A1 * | 2/2009 | Matsunaga et al. ........... 257/491 |

FOREIGN PATENT DOCUMENTS

| JP | 60-046041 | 3/1985 |
| JP | 62-065449 | 3/1987 |
| JP | 62-185331 | 8/1987 |
| JP | 03-163817 | 7/1991 |
| JP | 3-163817 | 7/1991 |
| JP | 6-45511 | 2/1994 |
| JP | 2004-336032 | 11/2004 |
| JP | 2005-175454 | 6/2005 |

\* cited by examiner

*Primary Examiner* — Chris Chu
(74) *Attorney, Agent, or Firm* — McDermott Will & Emery LLP

(57) ABSTRACT

On a semiconductor chip in a semiconductor integrated circuit, a plurality of circuit cells each of which has a pad are formed along a first chip side of the semiconductor chip. Among the plurality of circuit cells, one or more circuit cells at least in the vicinity of an end portion on the first chip side are arranged having a steplike shift in a direction apart from the first chip side with decreasing distance from the center portion to the end portion on the first chip side.

37 Claims, 27 Drawing Sheets

FIG. 6A
FIG. 6B
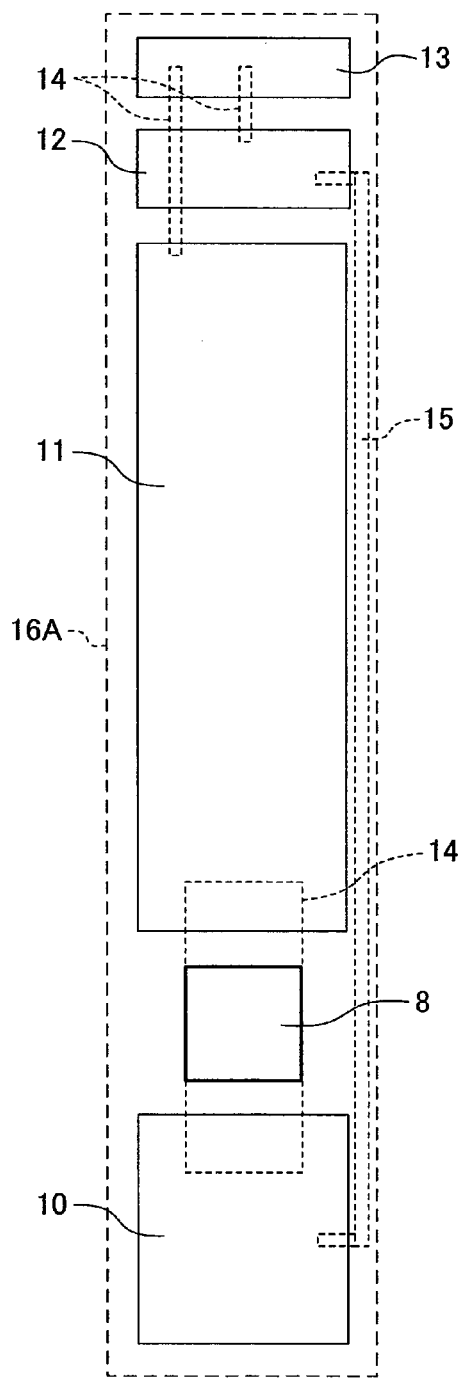
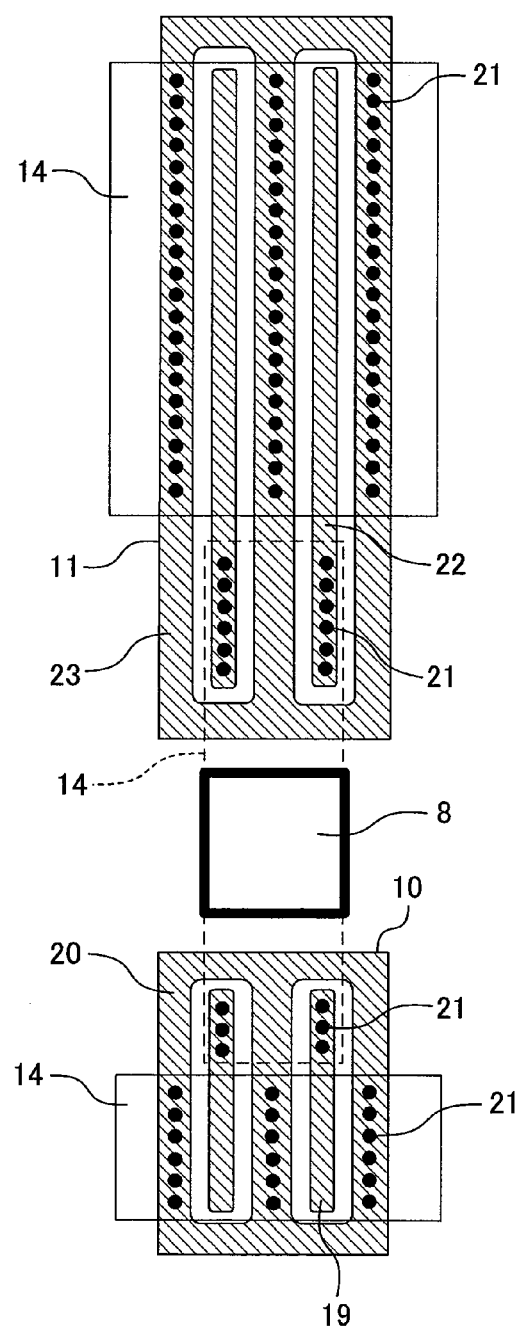

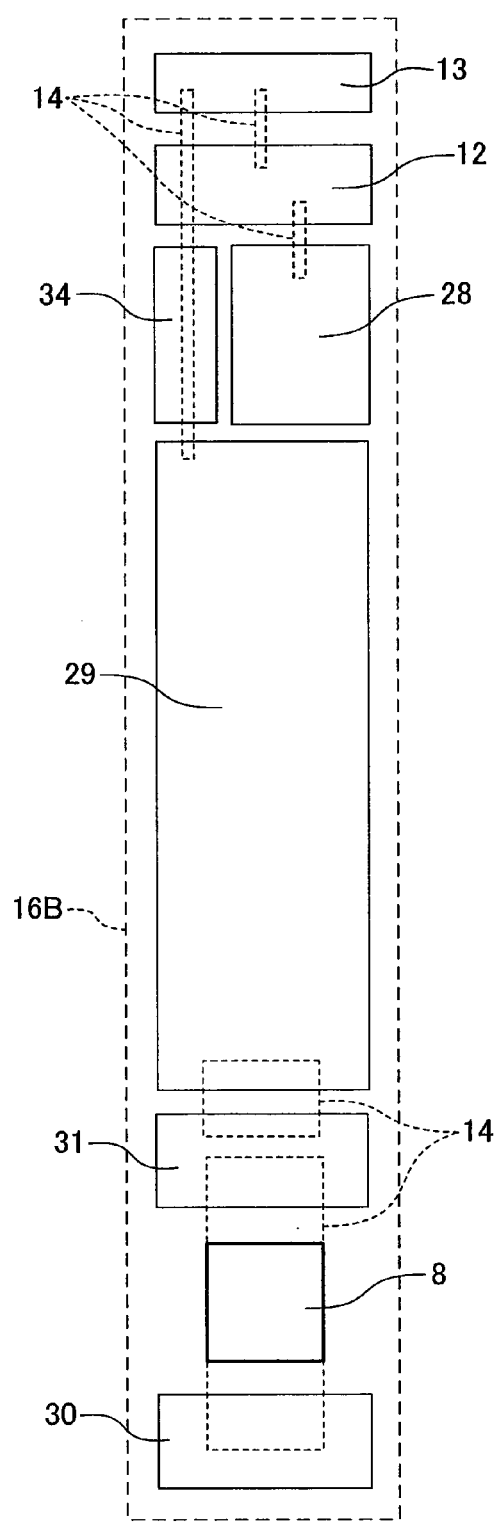
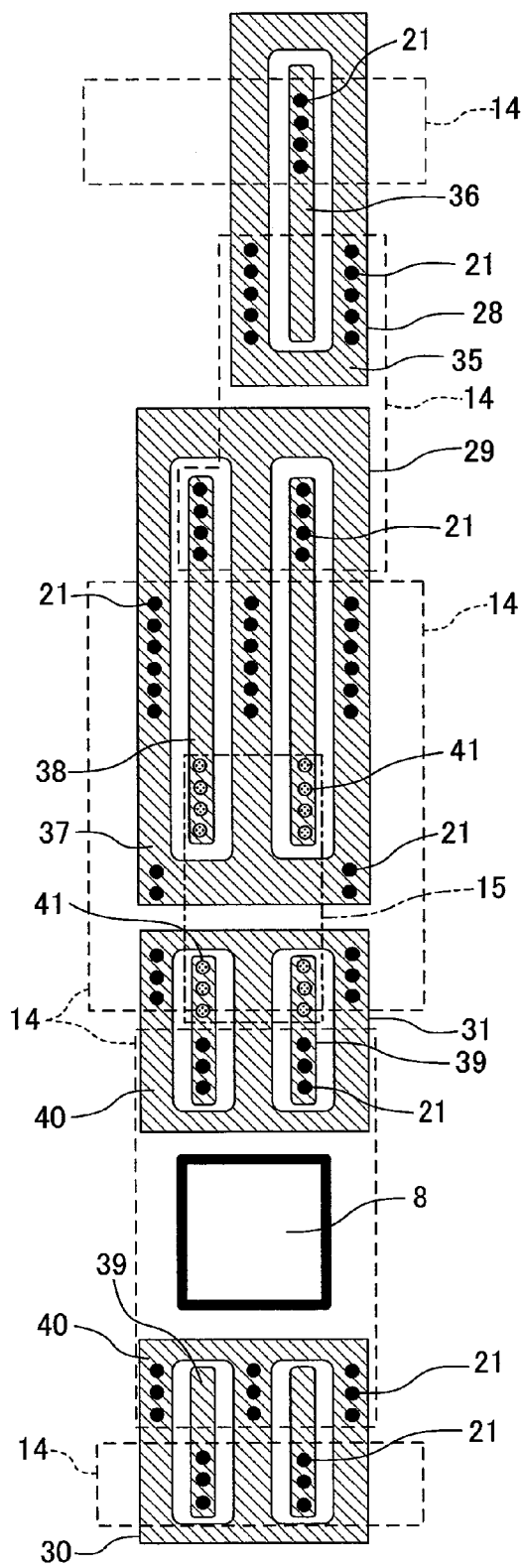
FIG. 9A
FIG. 9B

SEMICONDUCTOR INTEGRATED CIRCUIT

RELATED APPLICATIONS

This application is the U.S. National Phase under 35 U.S.C. §371 of International Application No. PCT/JP2006/319535, filed on Sep. 29, 2006, which in turn claims the benefit of Japanese Application No. 2006-056575, filed on Mar. 2, 2006, the disclosures of which Applications are incorporated by reference herein.

TECHNICAL FIELD

The present invention relates to a semiconductor integrated circuit. Specifically, the present invention relates to a layout of a multi-channel semiconductor integrated circuit for driving a capacitive load such as a plasma display.

BACKGROUND ART

Generally, a MOS output circuit, an IGBT output circuit, a high-sideless MOS output circuit, or a high-sideless IGBT output circuit has been known as an output circuit used for a multi-channel semiconductor integrated circuit. Moreover, as a layout of a multi-channel semiconductor integrated circuit which includes cells of such output circuits as standard cells, a layout, for example, as shown in FIG. 29 has been proposed. The layout in FIG. 29 has a plurality of standard cells arranged in a line along an outer circumference of a semiconductor chip 101 such that a pad 100 of each standard cell faces the outside of the semiconductor chip 101. In this layout, the standard cells in a center portion of respective sides of the semiconductor chip 101 are densely arranged, whereas the standard cells at respective corners of the semiconductor chip 101 are sparsely arranged (with regard to this layout, see Patent Document 1, for example).

Patent Document 1: Japanese Laid-Open Patent Publication No. 60-46041

DISCLOSURE OF INVENTION

Problems to be Solved by the Invention

However, the conventional layout of the multi-channel semiconductor integrated circuit has a problem that as shown in FIG. 29, adjacent bonding wires 103 connecting pads 100 included in standard cells with inner leads 102 may be in contact with each other, which causes a short circuit between outputs. This results in problems that the reliability as to assembly is insufficient and that characteristics of output circuits are not made uniform.

In view of the above-mentioned problems, an object of the present invention is to provide a semiconductor integrated circuit having a layout realizing an excellent reliability as to assembly and allowing characteristics of output circuits to be made uniform.

Means for Solving the Problems

To achieve the above-mentioned object, a semiconductor integrated circuit according to one aspect of the present invention includes a plurality of circuit cells on a semiconductor chip, the plurality of circuit cells being formed along a first chip side of the semiconductor chip and each of the plurality of circuit cells having a pad, wherein among the plurality of circuit cells, one or more circuit cells in the vicinity of at least an end portion of the first chip side are arranged having a steplike shift in a direction apart from the first chip side with decreasing distance from a center portion to the end portion of the first chip side.

The semiconductor integrated circuit according to the one aspect of the present invention may be configured such that the plurality of circuit cells is arranged having a steplike shift in a direction apart from the first chip side with decreasing distance from the center portion to the end portion of the first chip side.

In the semiconductor integrated circuit according to the one aspect of the present invention, each of the circuit cells includes: a high breakdown voltage driver; a pre-driver for driving the high breakdown voltage driver; and the pad.

In a first configuration (for example, a MOS output circuit) of the semiconductor integrated circuit according to the one aspect of the present invention, the high breakdown voltage driver includes a high-side transistor and a low-side transistor, and the pre-driver includes a level shift circuit for driving the high-side transistor.

In the first configuration, it is preferable that the pre-driver, the pad, the high-side transistor, the level shift circuit, and the low-side transistor are arranged in alignment with each other along a straight line, wherein at least the high-side transistor and the low-side transistor are arranged to face each other with the pad interposed therebetween.

The first configuration further includes: a control portion arranged in the center of the semiconductor chip; and a second circuit cell alignment of the plurality of circuit cells arranged along a second chip side facing the first chip side of the semiconductor chip, the second circuit cell alignment facing a first circuit cell alignment of the plurality of circuit cells arranged along the first chip side of the semiconductor chip with the control portion interposed therebetween.

The first configuration further includes: first power source pads for a high voltage potential, the first power source pads being arranged on both ends of each of the first circuit cell alignment and the second circuit cell alignment; second power source pads for a reference potential, the second power source pads being arranged on both the ends of each of the first circuit cell alignment and the second circuit cell alignment; first interconnects for the high voltage potential, the first interconnects being arranged over the high-side transistors in the first circuit cell alignment and the second circuit cell alignment and being electrically connected to the first power source pads; and second interconnects for the reference potential, the second interconnects being arranged over the low-side transistors in the first circuit cell alignment and the second circuit cell alignment and being electrically connected to the second power source pads.

In the first configuration, at least either of the first interconnects and the second interconnects have a width expanding from a center portion to an end portion in the length direction.

The first configuration further includes a third interconnect for a reference potential, the third interconnect surrounding the control portion arranged in the center of the semiconductor chip.

In the first configuration, each of the level shift circuit and the pre-driver is designed to have a cell width smaller than or equal to that of the low-side transistor.

The first configuration further includes a plurality of fourth interconnects for connecting the control portion to the pre-drivers included in at least one of the first circuit cell alignment and the second circuit cell alignment, the plurality of fourth interconnects having a uniform interconnect length.

In a second configuration (for example, an IGBT output circuit) of the semiconductor integrated circuit according to the one aspect of the present invention, the high breakdown voltage driver includes: a high-side transistor; a high-side regenerative diode; a low-side transistor; and a low-side regenerative diode.

In the second configuration, it is preferable that the pre-driver, the pad, the high-side transistor, the level shift circuit, the high-side regenerative diode, the low-side transistor, and the low-side regenerative diode are arranged in alignment with each other along a straight line, wherein at least the high-side regenerative diode and the low-side regenerative diode are arranged to face each other with the pad interposed therebetween.

The second configuration further includes: a control portion arranged in the center of the semiconductor chip; and a second circuit cell alignment of the plurality of circuit cells arranged along a second chip side facing the first chip side of the semiconductor chip, the second circuit cell alignment facing a first circuit cell alignment of the plurality of circuit cells arranged along the first chip side of the semiconductor chip with the control portion interposed therebetween.

The second configuration further includes: first power source pads for a high voltage potential, the first power source pads being arranged on both ends of each of the first circuit cell alignment and the second circuit cell alignment; second power source pads for a reference potential, the second power source pads being arranged on both the ends of each of the first circuit cell alignment and the second circuit cell alignment; first interconnects for the high voltage potential, the first interconnects being arranged over the high-side regenerative diodes in the first circuit cell alignment and the second circuit cell alignment and being electrically connected to the first power source pads; and second interconnects for the reference potential, the second interconnects being arranged over the low-side transistors in the first circuit cell alignment and the second circuit cell alignment and being electrically connected to the second power source pads.

In the second configuration, at least either of the first interconnects and the second interconnects have a width expanding from a center portion to an end portion in the length direction.

The second configuration further includes a third interconnect for a reference potential, the third interconnect surrounding the control portion arranged in the center of the semiconductor chip.

In the second configuration, each of the level shift circuit and the pre-driver is designed to have a cell width smaller than or equal to that of the low-side transistor.

The second configuration further includes a plurality of fourth interconnects for connecting the control portion to the pre-drivers included in at least one of the first circuit cell alignment and the second circuit cell alignment, the plurality of fourth interconnects having a uniform interconnect length.

In a third configuration (for example, a high-sideless MOS output circuit) of the semiconductor integrated circuit according to the one aspect of the present invention, the high breakdown voltage driver includes: an ESD protection device; and a low-side transistor.

In the third configuration, it is preferable that the pre-driver, the pad, the ESD protection device, and the low-side transistor are arranged in alignment with each other along a straight line, and at least the ESD protection device and the low-side transistor are arranged to face each other with the pad interposed therebetween.

The third configuration further includes: a control portion arranged in the center of the semiconductor chip; and a second circuit cell alignment of the plurality of circuit cells arranged along a second chip side facing the first chip side of the semiconductor chip, the second circuit cell alignment facing a first circuit cell alignment of the plurality of circuit cells arranged along the first chip side of the semiconductor chip with the control portion interposed therebetween.

The third configuration further includes: first power source pads for a high voltage potential, the first power source pads being arranged on both ends of each of the first circuit cell alignment and the second circuit cell alignment; second power source pads for a reference potential, the second power source pads being arranged on both the ends of each of the first circuit cell alignment and the second circuit cell alignment; first interconnects for the high voltage potential, the first interconnects being arranged over the ESD protection devices in the first circuit cell alignment and the second circuit cell alignment and being electrically connected to the first power source pads; and second interconnects for the reference potential, the second interconnects being arranged over the low-side transistors in the first circuit cell alignment and the second circuit cell alignment and being electrically connected to the second power source pads.

In the third configuration, at least either of the first interconnects and the second interconnects have a width expanding from a center portion to an end portion in the length direction.

The third configuration further includes a third interconnect for a reference potential, the third interconnect surrounding the control portion arranged in the center of the semiconductor chip.

In the third configuration, the pre-driver is designed to have a cell width smaller than or equal to that of the low-side transistor.

The third configuration further includes a plurality of fourth interconnects for connecting the control portion to the pre-drivers included in at least one of the first circuit cell alignment and the second circuit cell alignment, the plurality of fourth interconnects having a uniform interconnect length.

In a fourth configuration (for example, a high-sideless IGBT output circuit) of the semiconductor integrated circuit according to the one aspect of the present invention, the high breakdown voltage driver includes: an ESD protection device; a low-side regenerative diode; and a low-side transistor.

In the fourth configuration, it is preferable that the pre-driver, the pad, the ESD protection device, the low-side regenerative diode, and the low-side transistor are arranged in alignment with each other along a straight line, and at least the ESD protection device and the low-side regenerative diode are arranged to face each other with the pad interposed therebetween.

The fourth configuration further includes: a control portion arranged in the center of the semiconductor chip; and a second circuit cell alignment of the plurality of circuit cells arranged along a second chip side facing the first chip side of the semiconductor chip, the second circuit cell alignment facing a first circuit cell alignment of the plurality of circuit cells along the first chip side of the semiconductor chip with the control portion interposed therebetween.

The fourth configuration further includes: first power source pads for a high voltage potential, the first power source pads being arranged on both ends of each of the first circuit cell alignment and the second circuit cell alignment; second power source pads for a reference potential, the second power source pads being arranged on both the ends of each of the first circuit cell alignment and the second circuit cell alignment; first interconnects for the high voltage potential, the first interconnects being arranged over the ESD protection devices in the first circuit cell alignment and the second circuit cell alignment and being electrically connected to the first power source pads; and second interconnects for the reference potential, the second interconnects being arranged over the low-side transistors in the first circuit cell alignment and the second circuit cell alignment and being electrically connected to the second power source pads.

In the fourth configuration, at least either of the first interconnects and the second interconnects have a width expanding from a center portion to an end portion in the length direction.

The fourth configuration further includes a third interconnect for a reference potential, the third interconnect surrounding the control portion arranged in the center of the semiconductor chip.

In the fourth configuration, the pre-driver is designed to have a cell width smaller than or equal to that of the low-side transistor.

The fourth configuration further includes a plurality of fourth interconnects for connecting the control portion to the pre-drivers included in at least one of the first circuit cell alignment and the second circuit cell alignment, the plurality of fourth interconnects having a uniform interconnect length.

Effects of the Invention

According to the present invention, it is possible to prevent adjacent bonding wires from being in contact with each other and to realize uniform characteristics of output circuits. Moreover, minimizing wasted spaces between circuit cells can increase the integration degree of a semiconductor integrated circuit. Furthermore, imbalance in interconnect impedance from a high voltage power source pad to respective circuit cells can be reduced and a variation in electric characteristic such as ESD tolerance can be suppressed, so that it is possible to make electric characteristics of the output circuits uniform.

BRIEF DESCRIPTION OF DRAWINGS

FIGS. 6A and 6B are enlarged plan views each showing an output circuit cell according to Embodiment 1 of the present invention.

FIGS. 9A and 9B are enlarged plan views each showing an output circuit cell according to Embodiment 2 of the present invention.

DESCRIPTION OF REFERENCE NUMERALS

Figure 1:
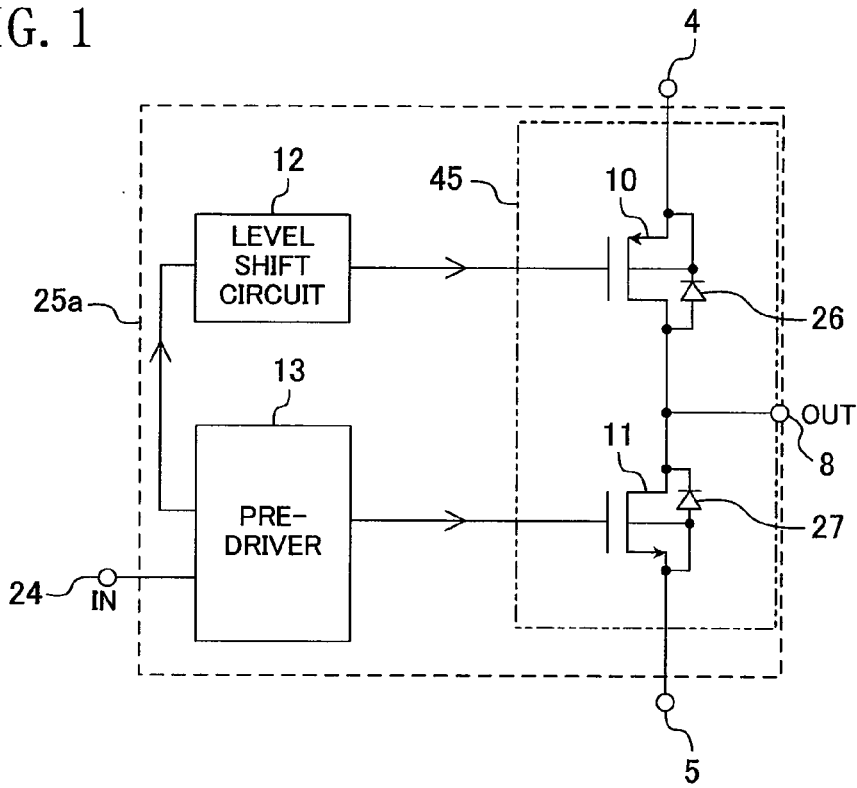
FIG. 1 is a view showing an exemplary circuit configuration of an output circuit including a MOS driver having a pad according to Embodiment 1 of the present invention.

1 semiconductor chip
2, 2b high voltage potential interconnect 3a, 3aA, 3aB, 3aC, 3aD, 3b reference potential interconnect
4 high voltage power source pad
5 reference potential pad
6 low breakdown voltage control portion
7 bus interconnect
8 pad
9 input control pad
10 high-side transistor
11 low-side transistor
12 level shift circuit
13 pre-driver
14 two-layer interconnect
15 one-layer interconnect
16A through 16D output circuit cell
17 inner lead
18 bonding wire
19 drain region of high-side transistor
20 source region of high-side transistor
21 through hole
22 drain region of low-side transistor
23 source region of low-side transistor
24 input terminal
25a through 25d output circuit
26 back gate-drain parasitic diode
27 back gate-drain parasitic diode
28 high-side transistor
29 low-side transistor
30 high-side regenerative diode
31 low-side regenerative diode
32 gate protection diode
33 gate-off resistor
34 gate protection circuit
35 emitter region of high-side transistor
36 corrector region of high-side transistor
37 emitter region of low-side transistor
38 corrector region of low-side transistor
39 cathode region of diode
40 anode region of diode
41 contact
43 ESD protection device
44 pre-driver
45 MOS driver
46 IGBT driver
47 high-sideless MOS driver
48 high-sideless IGBT driver

BEST MODE FOR CARRYING OUT THE INVENTION

Before describing Embodiments of the present invention, technical idea of the present invention in which Embodiments are comprehended will be described below.

Namely, the present invention is a semiconductor integrated circuit including a plurality of circuit cells on a semiconductor chip, the plurality of circuit cells being arranged along a first chip side of the semiconductor chip and each of the plurality of circuit cells having a pad, wherein among the plurality of circuit cells, one or more circuit cells in the vicinity of at least an end portion of the first chip side are arranged having a steplike shift in a direction apart from the first chip side with decreasing distance from a center portion to the end portion of the first chip side.

Thus, according to the semiconductor integrated circuit of the present invention, adjacent bonding wires can be prevented from being in contact with each other and characteristics of output circuits can be made uniform.

Each circuit cell of the semiconductor integrated circuit of the present invention includes a high breakdown voltage driver, a pre-driver for driving the high breakdown voltage driver, and a pad. Specifically, detailed descriptions will be given with reference to Embodiments. Examples of the circuit cell are an output circuit 25a including a MOS driver 45 of FIG. 1, an output circuit 25b including an IGBT driver 46 of FIG. 2, an output circuit 25c including a high-sideless MOS driver 47 of FIG. 3, and an output circuit 25d including a high-sideless IGBT driver 48 of FIG. 4.

Here, descriptions are given of exemplary basic circuit configurations of output circuits 25a through 25d of FIGS. 1 through 4.

The output circuit 25a of FIG. 1 includes a MOS driver 45, a level shift circuit 12, and a pre-driver 13. Here, the MOS driver 45 is composed of a high-side transistor 10, a parasitic diode 26 between the back gate and the drain of the high-side transistor 10, a low-side transistor 11, a parasitic diode 27 between the back gate and the drain of the low-side transistor 11, and a pad 8. Moreover, the high-side transistor 10 is connected to a high voltage power source pad 4. The low-side transistor 11 is connected to a reference potential pad 5. The pre-driver 13 is connected to an input terminal 24. Note that, the high-side transistor 10 is used for high level outputting, and the low-side transistor 11 is used for low level outputting.

Figure 2:
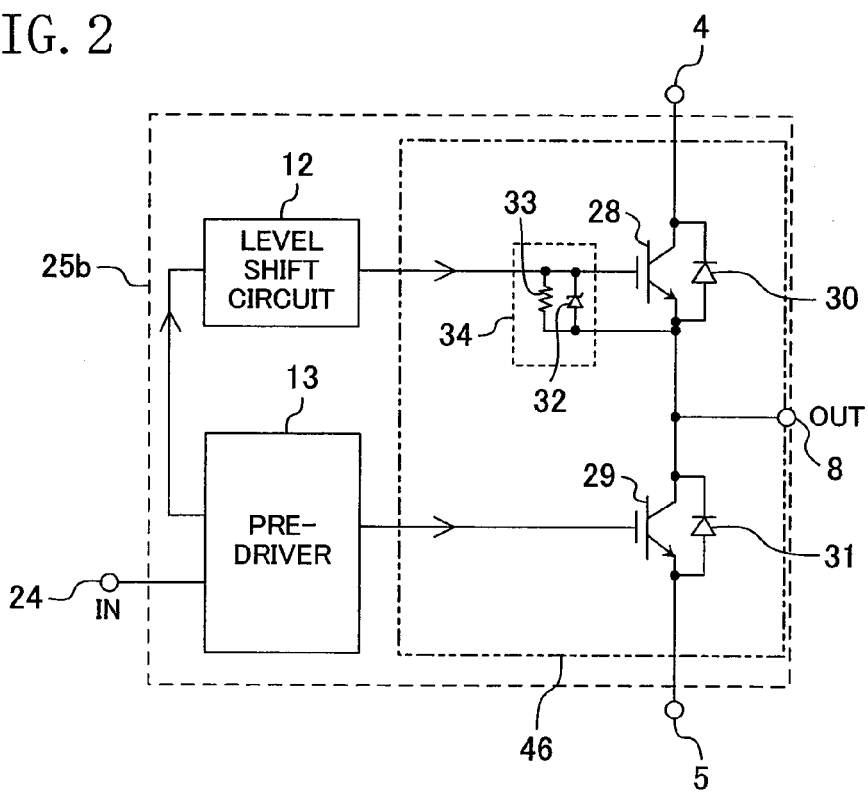
FIG. 2 is a view showing an exemplary circuit configuration of an output circuit including an IGBT driver having a pad according to Embodiment 2 of the present invention.

The output circuit 25b of FIG. 2 includes an IGBT driver 46, a level shift circuit 12, and a pre-driver 13. The IGBT driver 46 is composed of a high-side transistor 28, a gate protection circuit 34 having a gate-off resistor 33 and a gate protection diode 32, a high-side regenerative diode 30, a low-side transistor 29, a low-side regenerative diode 31, and a pad 8. Moreover, the high-side transistor 28 is connected to a high voltage power source pad 4. The low-side transistor 29 is connected to a reference potential pad 5. The pre-driver 13 is connected to an input terminal 24.

Figure 3:
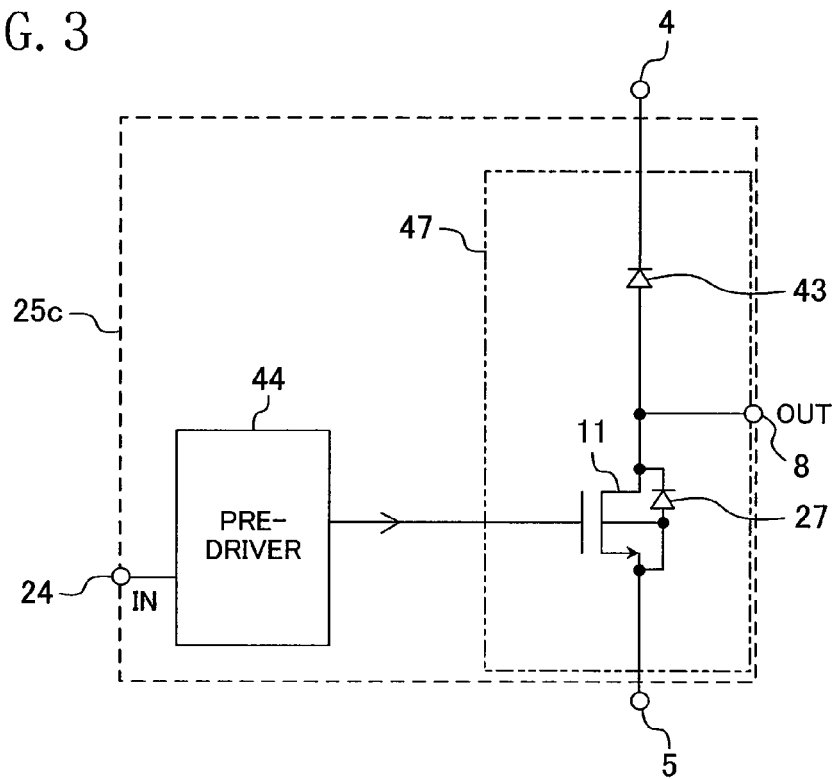
FIG. 3 is a view showing an exemplary circuit configuration of an output circuit including a high-sideless MOS driver having a pad according to Embodiment 3 of the present invention.

The output circuit 25c of FIG. 3 includes a high-sideless MOS driver 47 and a pre-driver 44. The high-sideless MOS driver 47 is composed of a low-side transistor 11, a back gate-drain parasitic diode 27 which is a parasitic element of the low-side transistor 11, an ESD protection device 43, and a pad 8. Moreover, one end of the low-side transistor 11 is connected to a high voltage power source pad 4. The other end of the low-side transistor 11 is connected to a reference potential pad 5. The pre-driver 44 is connected to an input terminal 24.

Figure 4:
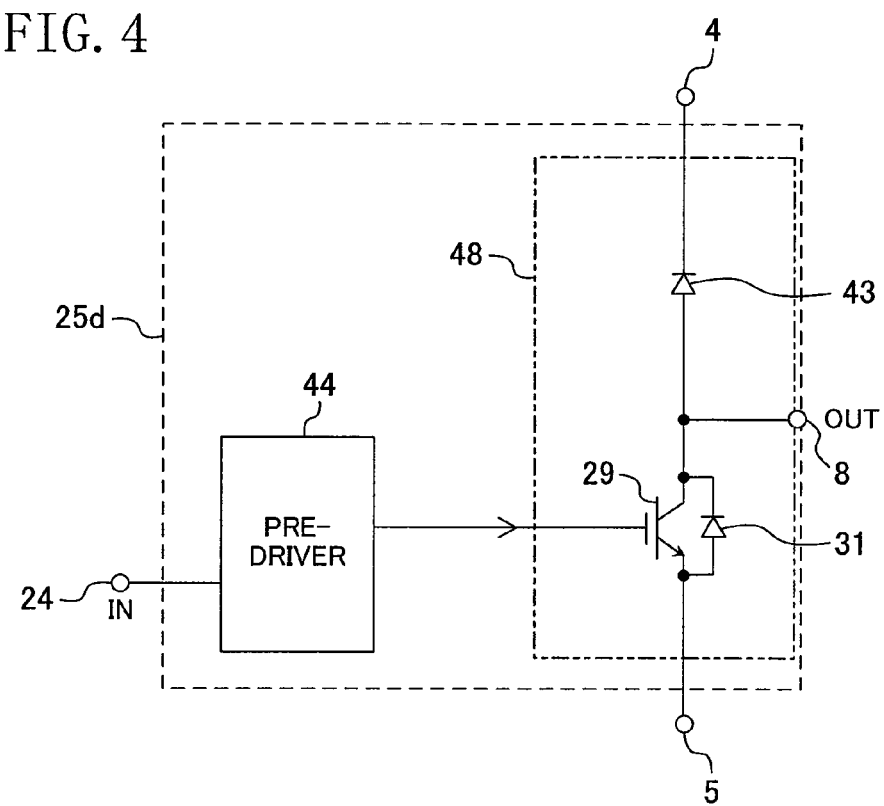
FIG. 4 is a view showing an exemplary circuit configuration of an output circuit including a high-sideless IGBT driver having a pad according to Embodiment 4 of the present invention.

The output circuit 25d of FIG. 4 includes a high-sideless IGBT driver 48 and a pre-driver 44. The high-sideless IGBT driver 48 is composed of a low-side transistor 29, a low-side regenerative diode 31, an ESD protection device 43, and a pad 8. Moreover, one end of the low-side transistor 29 is connected to a high voltage power source pad 4. The other end of the low-side transistor 29 is connected to a reference potential pad 5. The pre-driver 44 is connected to an input terminal 24.

Embodiments of the present invention will be described below in reference to the drawings, wherein the above-mentioned output circuits of FIGS. 1 through 4 are used as examples.

Embodiment 1

Figure 5:
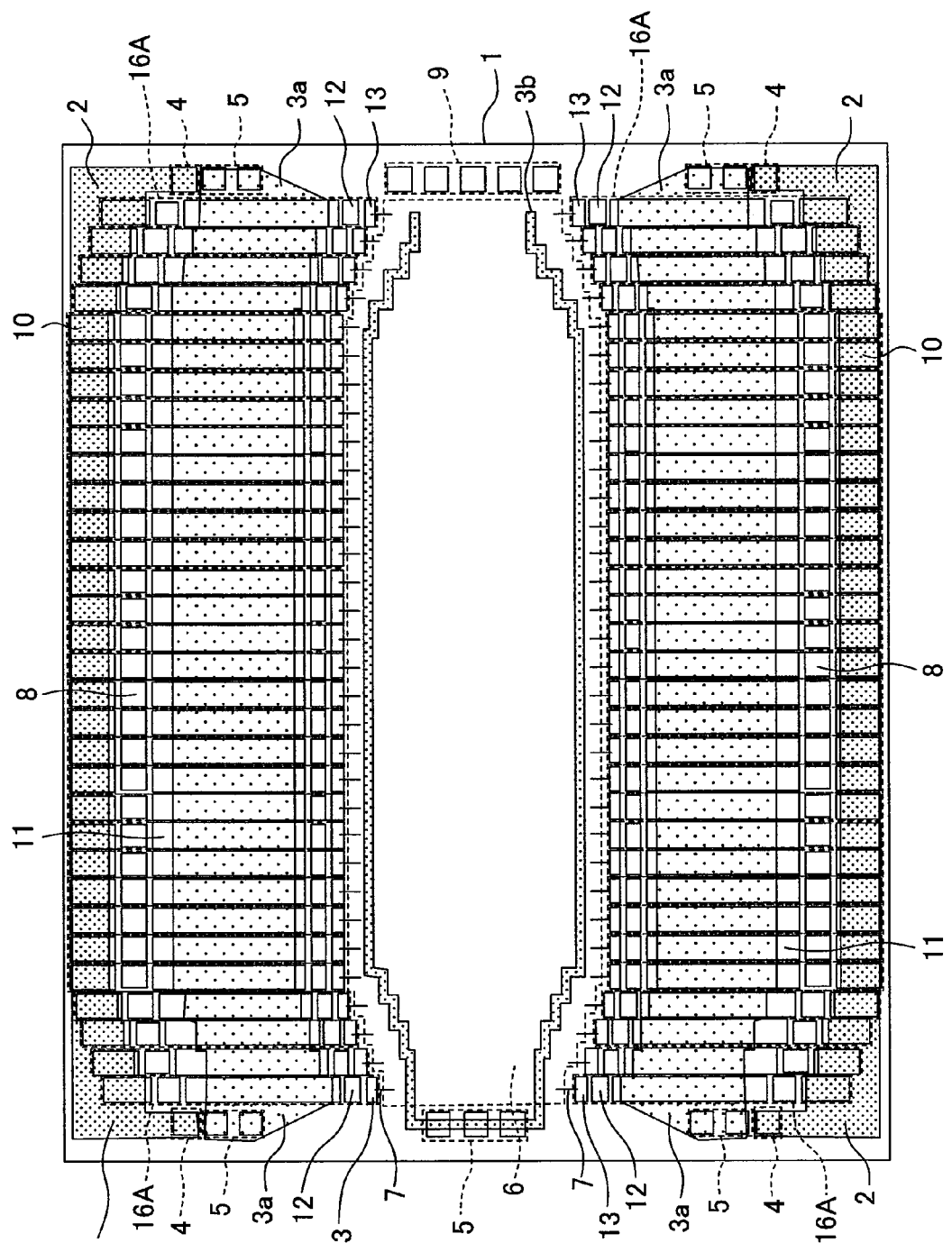
FIG. 5 is a plan view showing a layout of a semiconductor integrated circuit according to Embodiment 1 of the present invention.

FIG. 5 is a plan view illustrating a layout of a multi-channel semiconductor integrated circuit of Embodiment 1 of the present invention. Specifically, descriptions are given taking a multi-channel semiconductor integrated circuit provided with output circuits 25a each including the MOS driver 45 of FIG. 1 mentioned above as an example.

As shown in FIG. 5, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16A is arranged along chip sides to face each other with the low breakdown voltage control portion 6 interposed therebetween. Each of the plurality of circuit cells 16A has the configuration of the output circuit 25*a* of FIG. 1. The low breakdown voltage control portion 6 is connected to the output circuit cells 16A via bus interconnects 7. Moreover, high voltage power source pads 4 are arranged on both ends of the plurality of output circuit cells 16A, and reference potential pads 5 are arranged on both the ends of the plurality of output circuit cells 16A.

Each output circuit cell 16A is composed of the pad 8, the high-side transistor 10, the low-side transistor 11, the level shift circuit 12, and the pre-driver 13 which are arranged in alignment with each other along a straight line, wherein centering on the pad 8, the low-side transistor 11, the level shift circuit 12, and the pre-driver 13 are sequentially arranged on one side toward the low breakdown voltage control portion 6, and the high-side transistor 10 is arranged on the other side. It is to be noted that a timing control signal from the low breakdown voltage control portion 6 is transmitted to the pre-drivers 13 through the bus interconnects 7. Moreover, components in each output circuit cell 16A are connected by a two-layer interconnect 14 or a one-layer interconnect 15 as shown in FIGS. 6A and 6B. In FIG. 6B, a drain region 19 of the high-side transistor 10, a source region 20 of the high-side transistor 10, through holes 21, a drain region 22 of the low-side transistor 11, and a source region 23 of the low-side transistor 11 are shown.

As mentioned above, the high-side transistor 10 including the back gate-drain parasitic diode 26 and the low-side transistor 11 including the back gate-drain parasitic diode 27 are arranged with the pad 8 interposed therebetween, the back gate-drain parasitic diode 26 and the back gate-drain parasitic diode 27 also serving as ESD protection devices in consideration of improving the ESD tolerance. Thus, the effect of ESD protection can be enhanced. Moreover, each of the level shift circuit 12 and the pre-driver 13 is designed to have a cell width smaller than or equal to that of the low-side transistor 11, where the low-side transistor 11 has the largest cell width, so that the high integration can be realized.

Moreover, among the plurality of output circuit cells 16A, one or more output circuit cells (in FIG. 5, four output circuit cells) in the vicinity of end portions of the chip sides of the semiconductor chip 1 (at corners of the semiconductor chip 1) are arranged having a steplike shift in a direction apart from the chip sides with decreasing distance from a center portion to the end portions of the chip sides. Meanwhile, among the plurality of output circuit cells 16A, one or more output circuit cells in the center portion of the chip sides of the semiconductor chip 1 (in FIG. 5, standard cells excepting the four output circuit cells at each corner) are evenly arranged along the chip sides without being shifted.

Figure 7:
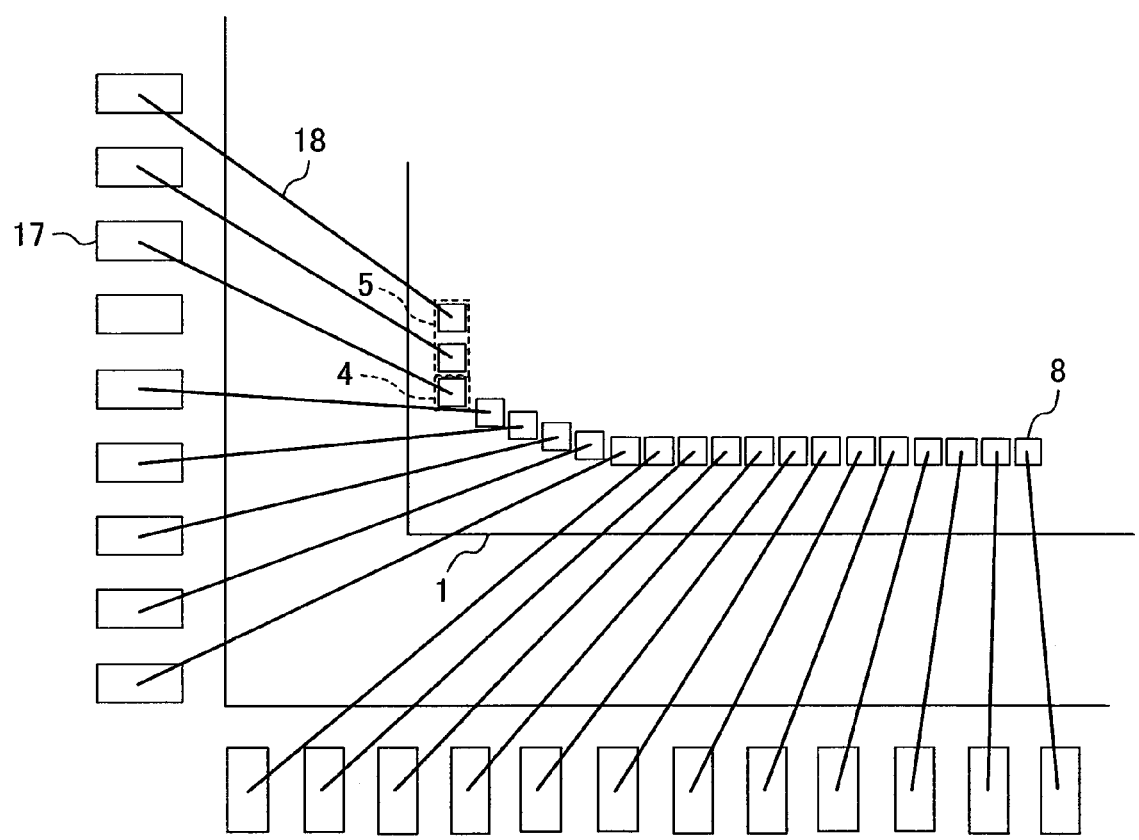
FIG. 7 is a plan view showing how wires are bonded in the semiconductor integrated circuit according to Embodiment 1 of the present invention.

That is, as shown in FIG. 7 which is an enlarged view showing how wires are bonded in the multi-channel semiconductor integrated circuit of the present embodiment, to prevent bonding wires 18 connecting the pads 8 with inner leads 17 from being in contact with each other, the pads 8 included in the output circuit cells 16A in the vicinity of the corners of the semiconductor chip 1 are arranged having a steplike shift as described above, and the pads 8 in the other portions of the semiconductor chip 1 are evenly arranged without being shifted.

Figure 29:
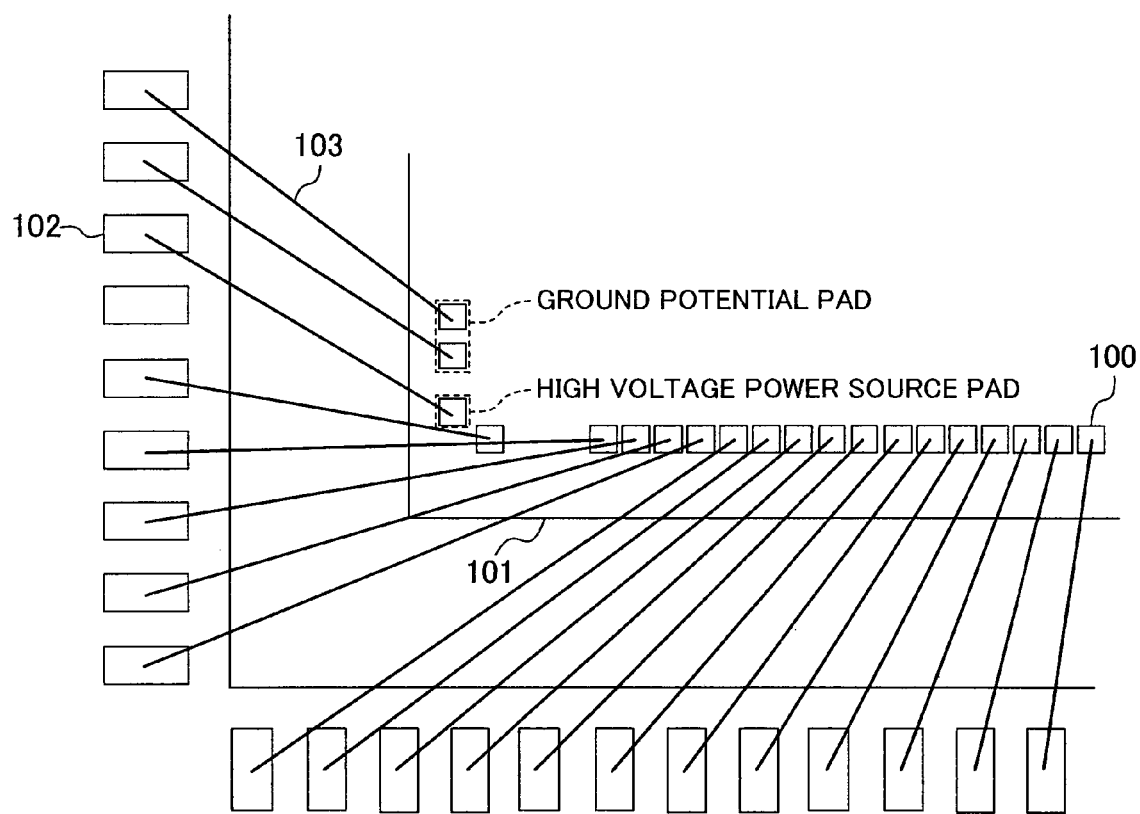
FIG. 29 is an enlarged plan view showing how wires are bonded in a conventional semiconductor integrated circuit.

With this layout, enhancement of reliability as to assembly can be realized. That is, even if the number of output circuit cells 16A or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3*a* are formed such that each of the interconnects 3*a* lies over the low-side transistors 11 in the output circuit cells 16A and is connected to the reference potential pads 5 arranged on both the ends of the plurality of output circuit cells 16A.

In the same manner, high voltage potential interconnects 2 are formed such that each of the high voltage potential interconnects 2 lies over the high-side transistors 10 in the output circuit cells 16A and is connected to the high voltage power source pads 4 arranged on both the ends of the plurality of output circuit cells 16A. Here, as described above, the plurality of output circuit cells 16A is stepwise arranged in the vicinity of the corners of the semiconductor chip 1. Therefore, by making use of this layout, the width of each high voltage potential interconnect 2 is expanded in the vicinity of the corners so that portions on which a load current from the pads 8 concentrates are wide. Thus, it is possible to reduce an interconnect resistance to the high voltage power source pads 4 on which the load current from the pads 8 concentrates. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16A on the semiconductor chip 1, potentials of the reference potential pads 5 and the high voltage power source pads 4 are stable. Therefore, it is possible to reduce the interconnect impedance of each of the reference potential interconnects 3*a* and the high voltage potential interconnects 2. Moreover, even when large currents are output from respective channels, the reference potential and the high voltage potential of each of the output circuit cells 16A are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3*b* is arranged to surround three sides excepting the side where the input control pad 9 is arranged. The reference potential interconnect 3*b* serves as a shield which prevents an outer noise input from the pads 8 from being transmitted to the low breakdown voltage control portion 6 via the output control cells 16A. Therefore, a signal input from the low breakdown voltage control portion 6 to the pre-drivers 13 is stabilized, which makes the output characteristics uniform. It is to be noted that as the output circuit cells 16A in the vicinity of the corners of the semiconductor chip 1 are arranged having a steplike shift, the low breakdown voltage control portion 6 is likewise formed to have a steplike shape at four corners corresponding to the corners of the semiconductor chip 1.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 13. Therefore, in the present embodiment, the bus interconnects 7 connecting the pre-drives 13 with the low breakdown voltage control portion 6 have substantially the same length. Therefore, the delay times are made uniform to prevent the output characteristics from being unbalanced due to the difference in delay time between output channels.

Embodiment 2

Figure 8:
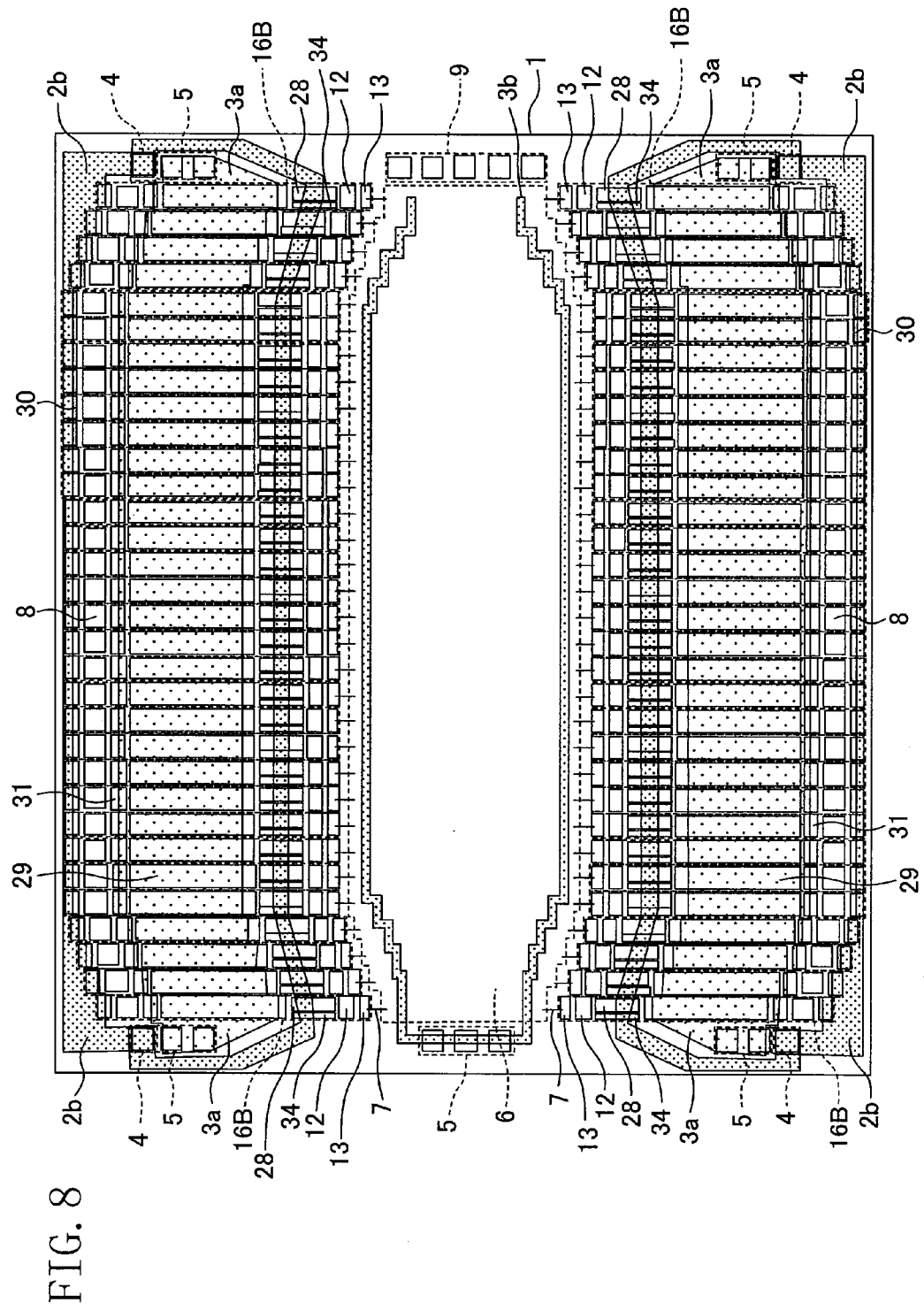
FIG. 8 is a plan view showing a layout of a semiconductor integrated circuit according to Embodiment 2 of the present invention.

FIG. 8 is a plan view illustrating a layout of a multi-channel semiconductor integrated circuit of Embodiment 2 of the present invention. Specifically, descriptions are given taking a multi-channel semiconductor integrated circuit provided with output circuits 25b each including the IGBT driver 46 of FIG. 2 mentioned above as an example.

As shown in FIG. 8, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16B is arranged along chip sides to face each other with the low breakdown voltage control portion 6 interposed therebetween. Each of the plurality of circuit cells 16B has the configuration of the output circuit 25b of FIG. 2. The low breakdown voltage control portion 6 is connected to the output circuit cells 16B via bus interconnects 7. Moreover, high voltage power source pads 4 are arranged on both ends of the plurality of output circuit cells 16B, and reference potential pads 5 are arranged on both the ends of the plurality of output circuit cells 16B.

Each output circuit cell 16B is composed of the pad 8, the high-side transistor 28, the low-side transistor 29, the high-side regenerative diode 30, the low-side regenerative diode 31, the level shift circuit 12, and the pre-driver 13 which are arranged in alignment with each other along a straight line, wherein centering on the pad 8, the low-side regenerative diode 31, the low-side transistor 29, the high-side transistor 28, the gate protection circuit 34, the level shift circuit 12, and the pre-driver 13 are sequentially arranged on one side toward the low breakdown voltage control portion 6, and the high-side regenerative diode 30 is arranged on the other side. It is to be noted that a timing control signal from the low breakdown voltage control portion 6 is transmitted to the pre-drivers 13 through the bus interconnects 7. Moreover, components in each output circuit cell 16B are connected by a two-layer interconnect 14 or a one-layer interconnect 15 as shown in FIGS. 9A and 9B. In FIG. 9B, through holes 21, contacts 41, an emitter region 35 of the high-side transistor 28, a corrector region 36 of the high-side transistor 28, an emitter region 37 of the low-side transistor 29, a corrector region 38 of the low-side transistor 29, a cathode region 39 of the low-side regenerative diode 31 and the high-side regenerative diode 30, and an anode region 40 of the low-side regenerative diode 31 and the high-side regenerative diode 30 are shown.

As mentioned above, the high-side regenerative diode 30 and the low-side regenerative diode 31 which also serve as ESD protection devices in consideration of improving the ESD tolerance are arranged with the pad 8 interposed therebetween, so that the effect of ESD protection can be enhanced. Moreover, each of the level shift circuit 12 and the pre-driver 13 is designed to have a cell width smaller than or equal to that of the low-side transistor 29, where the low-side transistor 29 has the largest cell width, so that the high integration can be realized.

Moreover, among the plurality of output circuit cells 16B, one or more output circuit cells (in FIG. 8, four output circuit cells) in the vicinity of end portions of the chip sides of the semiconductor chip 1 (at corners of the semiconductor chip 1) are arranged having a steplike shift in a direction apart from the chip sides with decreasing distance from a center portion to the end portions of the chip sides. Meanwhile, among the plurality of output circuit cells 16B, one or more output circuit cells in the center portion of the chip sides of the semiconductor chip 1 (in FIG. 8, standard cells excepting the four output circuit cells at each corner) are evenly arranged along the chip sides without being shifted.

Figure 10:
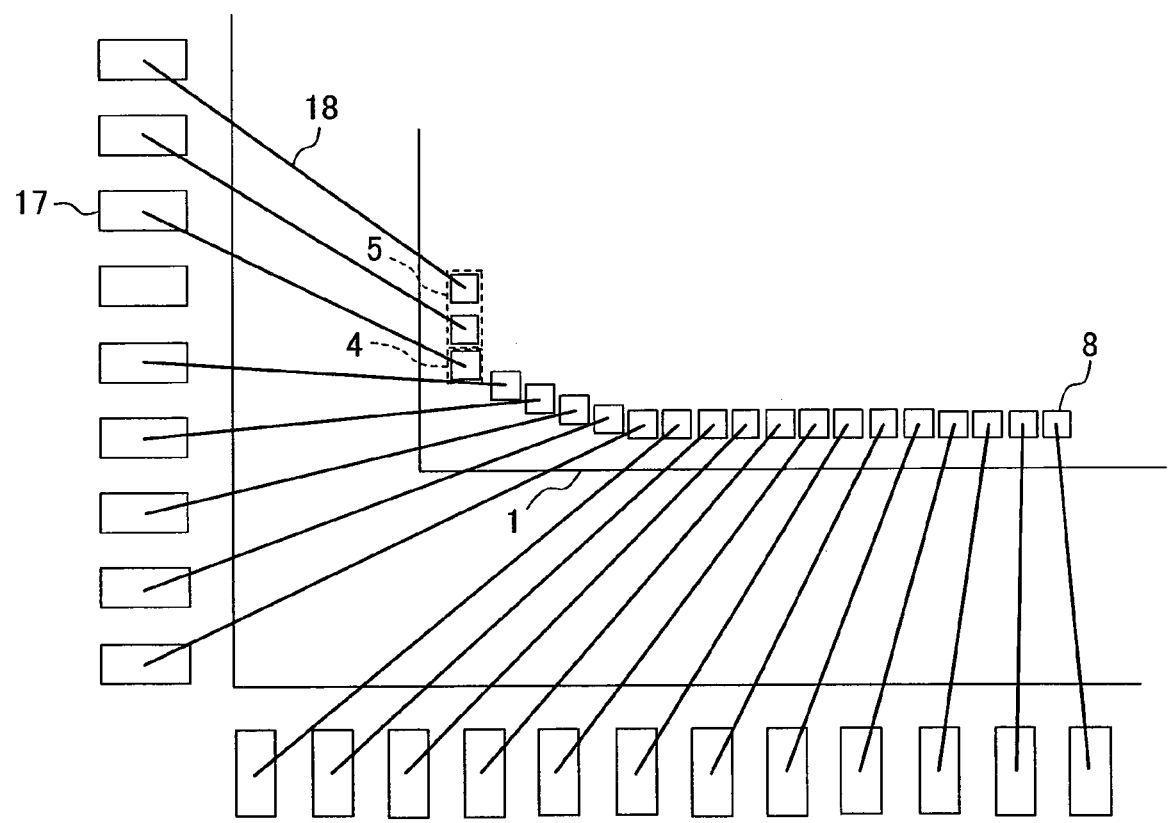
FIG. 10 is a plan view showing how wires are bonded in the semiconductor integrated circuit according to Embodiment 2 of the present invention.

That is, as shown in FIG. 10 which is an enlarged view showing how wires are bonded in the multi-channel semiconductor integrated circuit of the present embodiment, to prevent bonding wires 18 connecting the pads 8 with inner leads 17 from being in contact with each other, the pads 8 included in the output circuit cells 16B in the vicinity of the corners of the semiconductor chip 1 are arranged having a steplike shift as described above, and the pads 8 in the other portions of the semiconductor chip 1 are evenly arranged without being shifted.

With this layout, enhancement of reliability as to assembly can be realized. That is, even if the number of output circuit cells 16B or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3a are formed such that each of the interconnects 3a lies over the low-side transistors 29 and the low-side regenerative diodes 31 in the output circuit cells 16B and is connected to the reference potential pads 5 arranged on both the ends of the plurality of output circuit cells 16B.

In the same manner, high voltage potential interconnects 2b are formed such that each of the high voltage potential interconnects 2b lies over the high-side transistors 28 and the high-side regenerative diodes 30 in the output circuit cells 16B and is connected to the high voltage power source pads 4 arranged on both the ends of the plurality of output circuit cells 16B. Here, as described above, the plurality of output circuit cells 16B is stepwise arranged in the vicinity of the corners of the semiconductor chip 1. Therefore, by making use of this layout, the width of each high voltage potential interconnect 2b is expanded in the vicinity of the corners so that portions on which a load current from the pads 8 concentrates are wide. Thus, it is possible to reduce an interconnect resistance to the high voltage power source pads 4 on which the load current from the pads 8 concentrates. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16B on the semiconductor chip 1, potentials of the reference potential pads 5 and the high voltage power source pads 4 are stable. Therefore, it is possible to reduce the interconnect impedance of each of the reference potential interconnects 3*a* and the high voltage potential interconnects 2*b*. Moreover, even when large currents are output from respective channels, the reference potential and the high voltage potential of each of the output circuit cells 16B are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3*b* is arranged to surround three sides excepting the side where the input control pad 9 is arranged. The reference potential interconnect 3*b* serves as a shield which prevents an outer noise input from the pads 8 from being transmitted to the low breakdown voltage control portion 6 via the output control cells 16B. Therefore, a signal input from the low breakdown voltage control portion 6 to the pre-drivers 13 is stabilized, which makes the output characteristics uniform. It is to be noted that as the output circuit cells 16B in the vicinity of the corners of the semiconductor chip 1 are arranged having a steplike shift, the low breakdown voltage control portion 6 is likewise formed to have a steplike shape at four corners corresponding to the corners of the semiconductor chip 1.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 13. Therefore, in the present embodiment, the bus interconnects 7 connecting the pre-drives 13 with the low breakdown voltage control portion 6 have substantially the same length. Therefore, the delay times are made uniform to prevent the output characteristics from being unbalanced due to the difference in delay time between output channels.

Embodiment 3

Figure 11:
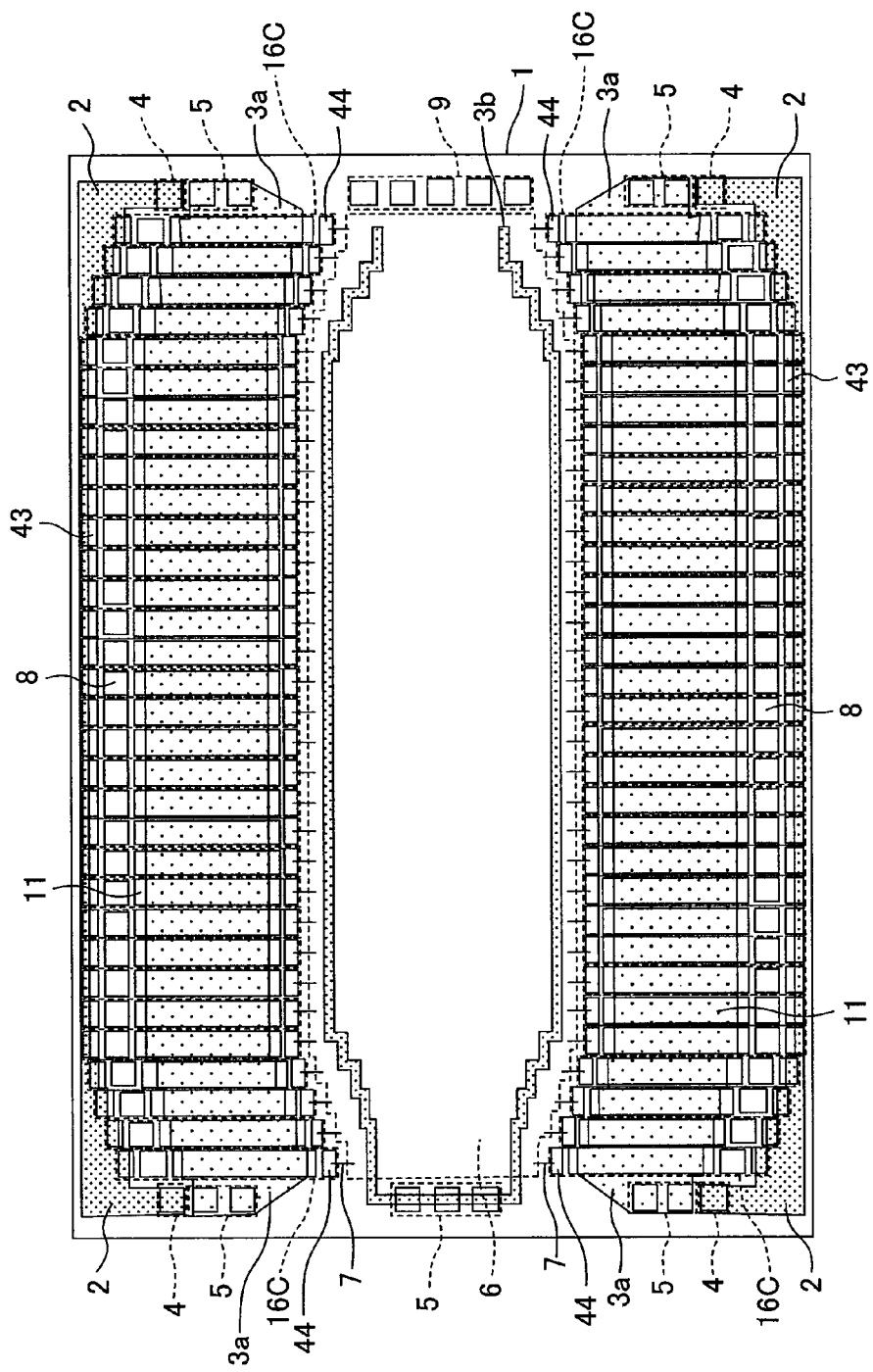
FIG. 11 is a plan view showing a layout of a semiconductor integrated circuit according to Embodiment 3 of the present invention.

FIG. 11 is a plan view illustrating a layout of a multi-channel semiconductor integrated circuit of Embodiment 3 of the present invention. Specifically, descriptions are given taking a multi-channel semiconductor integrated circuit provided with output circuits 25*c* each including the high-side-less MOS driver 47 of FIG. 3 mentioned above as an example.

As shown in FIG. 11, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16C is arranged along chip sides to face each other with the low breakdown voltage control portion 6 interposed therebetween. Each of the plurality of circuit cells 16C has the configuration of the output circuit 25*c* of FIG. 3. The low breakdown voltage control portion 6 is connected to the output circuit cells 16C via bus interconnects 7. Moreover, high voltage power source pads 4 are arranged on both ends of the plurality of output circuit cells 16C, and reference potential pads 5 are arranged on both the ends of the plurality of output circuit cells 16C.

Figure 12A:
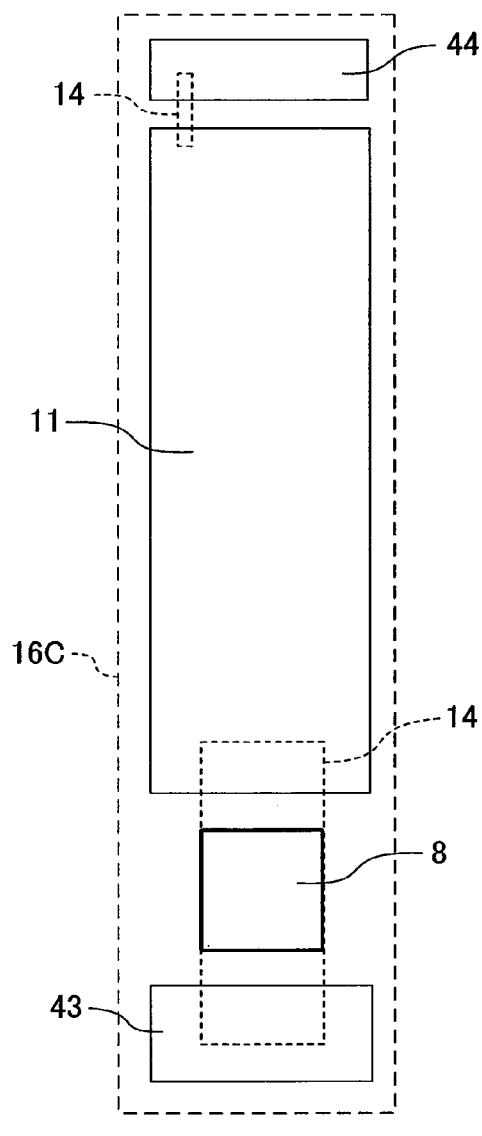
FIGS. 12A and 12B are enlarged plan views each showing an output circuit cell according to Embodiment 3 of the present invention.
Figure 12B:
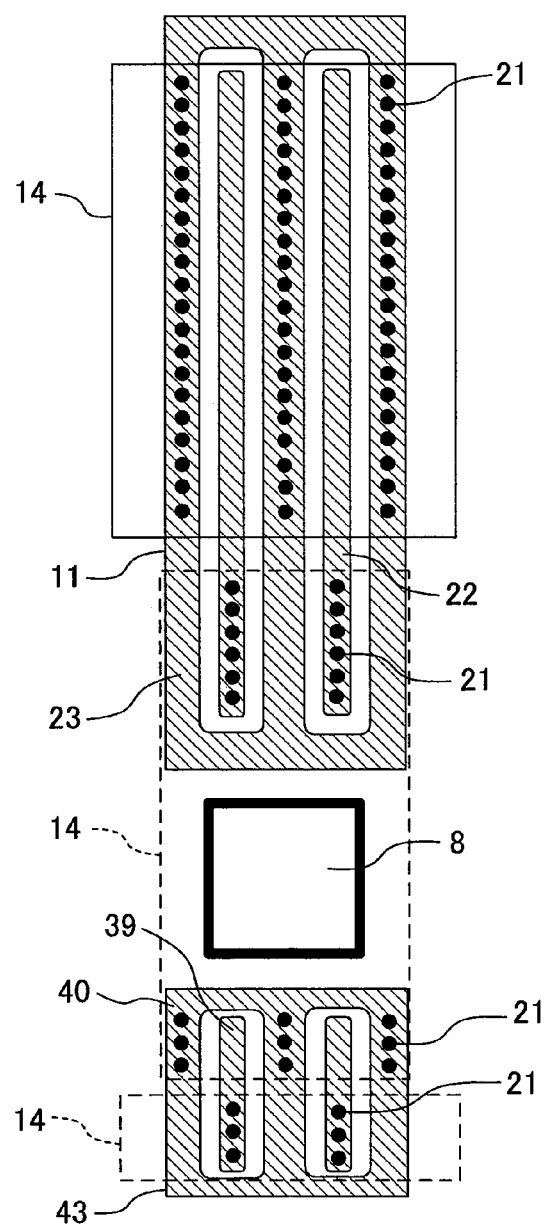

Each output circuit cell 16C is composed of the pad 8, the low-side transistor 11, the pre-driver 44, and the ESD protection device 43 which are arranged in alignment with each other along a straight line, wherein centering on the pad 8, the low-side transistor 11 and the pre-driver 44 are sequentially arranged on one side toward the low breakdown voltage control portion 6, and the ESD protection device 43 is arranged on the other side. It is to be noted that a timing control signal from the low breakdown voltage control portion 6 is transmitted to the pre-drivers 44 through the bus interconnects 7. Moreover, components in each output circuit cell 16C are connected by a two-layer interconnect 14 as shown in FIGS. 12A and 12B. In FIG. 12B, through holes 21, a drain region 22 of the low-side transistor 11, a source region 23 of the low-side transistor 11, a cathode region 39 of the ESD protection device 43, and the anode region 40 of the ESD protection device 43 are shown.

As mentioned above, the ESD protection device 43 and the low-side transistor 11 including the back gate-drain parasitic diode 27 are arranged with the pad 8 interposed therebetween, the back gate-drain parasitic diode 27 also serving as an ESD protection device in consideration of improving the ESD tolerance. Thus, the effect of ESD protection can be enhanced. Moreover, the pre-driver 44 is designed to have a cell width smaller than or equal to that of the low-side transistor 11, where the low-side transistor 11 has the largest cell width, so that the high integration can be realized.

Moreover, among the plurality of output circuit cells 16C, one or more output circuit cells 16C (in FIG. 11, four output circuit cells) in the vicinity of end portions of the chip sides of the semiconductor chip 1 (at corners of the semiconductor chip 1) are arranged having a steplike shift in a direction apart from the chip sides with decreasing distance from a center portion to the end portions of the chip sides. Meanwhile, among the plurality of output circuit cells 16C, one or more output circuit cells in the center portion of the chip sides of the semiconductor chip 1 (in FIG. 11, standard cells excepting the four output circuit cells at each corner) are evenly arranged along the chip sides without being shifted.

Figure 13:
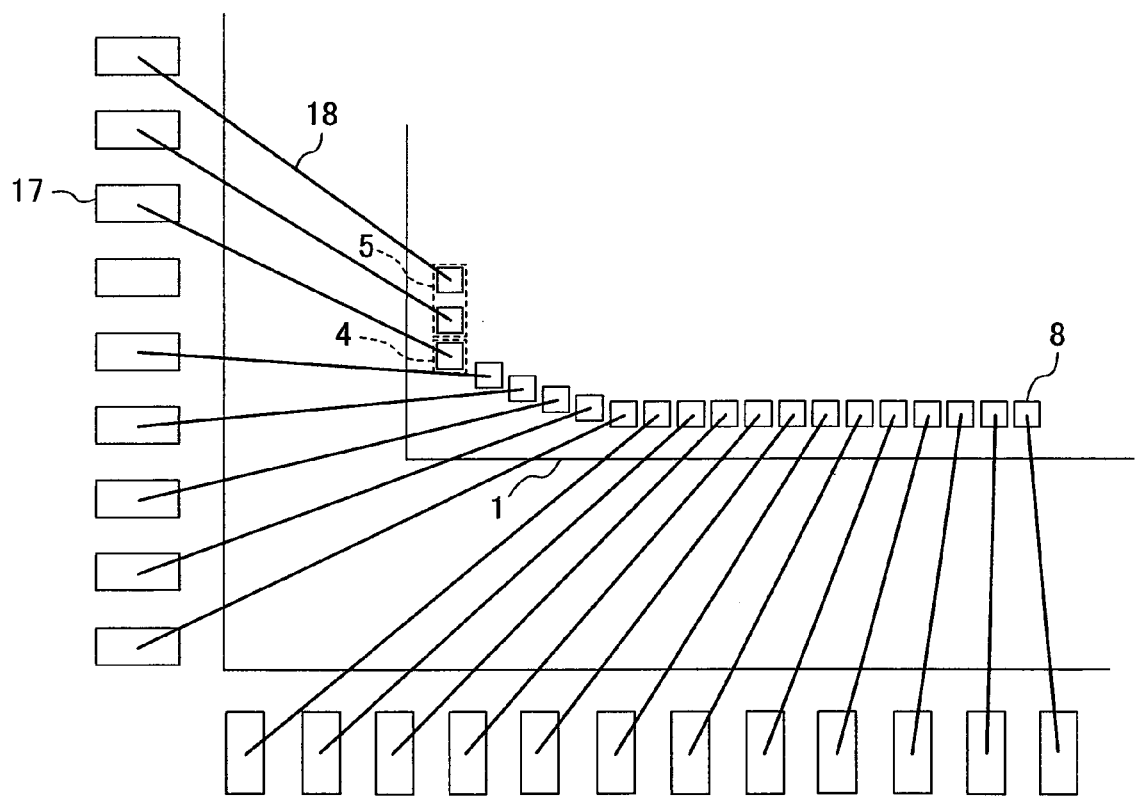
FIG. 13 is a plan view showing how wires are bonded in the semiconductor integrated circuit according to Embodiment 3 of the present invention.

That is, as shown in FIG. 13 which is an enlarged view showing how wires are bonded in the multi-channel semiconductor integrated circuit of the present embodiment, to prevent bonding wires 18 connecting the pads 8 with inner leads 17 from being in contact with each other, the pads 8 included in the output circuit cells 16C in the vicinity of the corners of the semiconductor chip 1 are arranged having a steplike shift as described above, and the pads 8 in the other portions of the semiconductor chip 1 are evenly arranged without being shifted.

With this layout, enhancement of reliability as to assembly can be realized. That is, even if the number of output circuit cells 16C or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3*a* are formed such that each of the interconnects 3*a* lies over the low-side transistors 11 in the output circuit cells 16C and is connected to the reference potential pads 5 arranged on both the ends of the plurality of output circuit cells 16C.

In the same manner, high voltage potential interconnects 2 are formed such that each of the high voltage potential interconnects 2 lies over the protection devices 43 in the output circuit cells 16C and is connected to the high voltage power source pads 4 arranged on both the ends of the plurality of output circuit cells 16C. Here, as described above, the plurality of output circuit cells 16C is stepwise arranged in the vicinity of the corners of the semiconductor chip 1. Therefore, by making use of this layout, the width of each high voltage potential interconnect 2 is expanded in the vicinity of the corners so that portions on which a load current from the pads 8 concentrates are wide. Thus, it is possible to reduce an interconnect resistance to the high voltage power source pads 4 on which the load current from the pads 8 concentrates. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16C on the semiconductor chip 1, potentials of the reference potential pads 5 and the high voltage power source pads 4 are stable. Therefore, it is possible to reduce the interconnect impedance of each of the reference potential interconnects 3a and the high voltage potential interconnects 2. Moreover, even when large currents are output from respective channels, the reference potential and the high voltage potential of each of the output circuit cells 16C are stable, which makes it possible to obtain the output characteristics and the ESD tolerance breakdown which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3b is arranged to surround three sides excepting the side where the input control pad 9 is arranged. The reference potential interconnect 3b serves as a shield which prevents an outer noise input from the pads 8 from being transmitted to the low breakdown voltage control portion 6 via the output control cells 16C. Therefore, a signal input from the low breakdown voltage control portion 6 to the pre-drivers 44 is stabilized, which makes the output characteristics uniform. It is to be noted that as the output circuit cells 16C in the vicinity of the corners of the semiconductor chip 1 are arranged having a steplike shift, the low breakdown voltage control portion 6 is likewise formed to have a steplike shape at four corners corresponding to the corners of the semiconductor chip 1.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 44. Therefore, in the present embodiment, the bus interconnects 7 connecting the pre-drives 44 with the low breakdown voltage control portion 6 have substantially the same length. Therefore, the delay times are made uniform to prevent the output characteristics from being unbalanced due to the difference in delay time between output channels.

Embodiment 4

Figure 14:
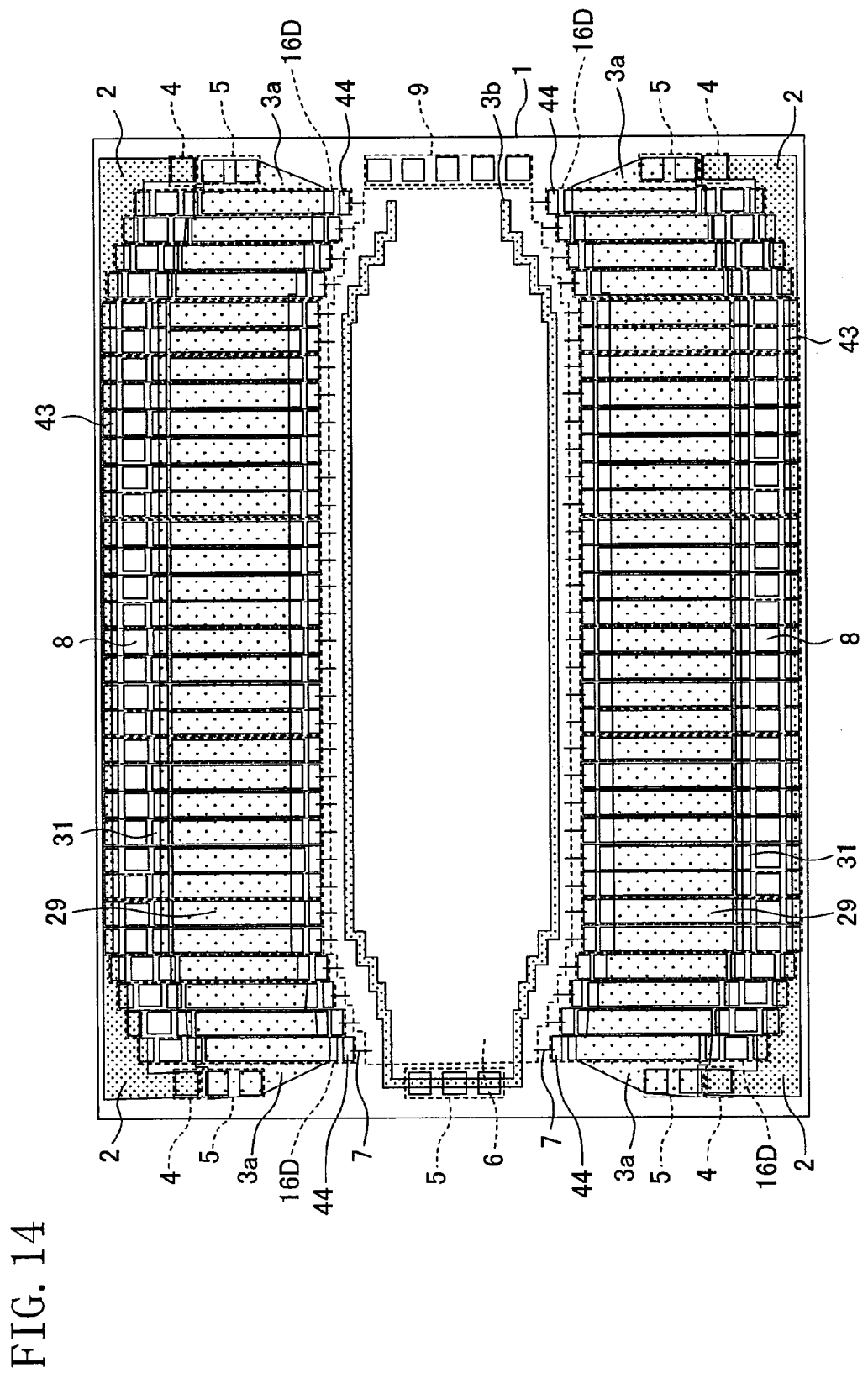
FIG. 14 is a plan view showing a layout of a semiconductor integrated circuit according to Embodiment 4 of the present invention.

FIG. 14 is a plan view illustrating a layout of a multi-channel semiconductor integrated circuit of Embodiment 4 of the present invention. Specifically, descriptions are given taking a multi-channel semiconductor integrated circuit provided with output circuits 25d each including the high-side-less IGBT driver 48 of FIG. 4 mentioned above as an example.

As shown in FIG. 14, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16D is arranged along chip sides to face each other with the low breakdown voltage control portion 6 interposed therebetween. Each of the plurality of circuit cells 16D has the configuration of the output circuit 25d of FIG. 4. The low breakdown voltage control portion 6 is connected to the output circuit cells 16D via bus interconnects 7. Moreover, high voltage power source pads 4 are arranged on both ends of the plurality of output circuit cells 16D, and reference potential pads 5 are arranged on both the ends of the plurality of output circuit cells 16D.

Figure 15A:
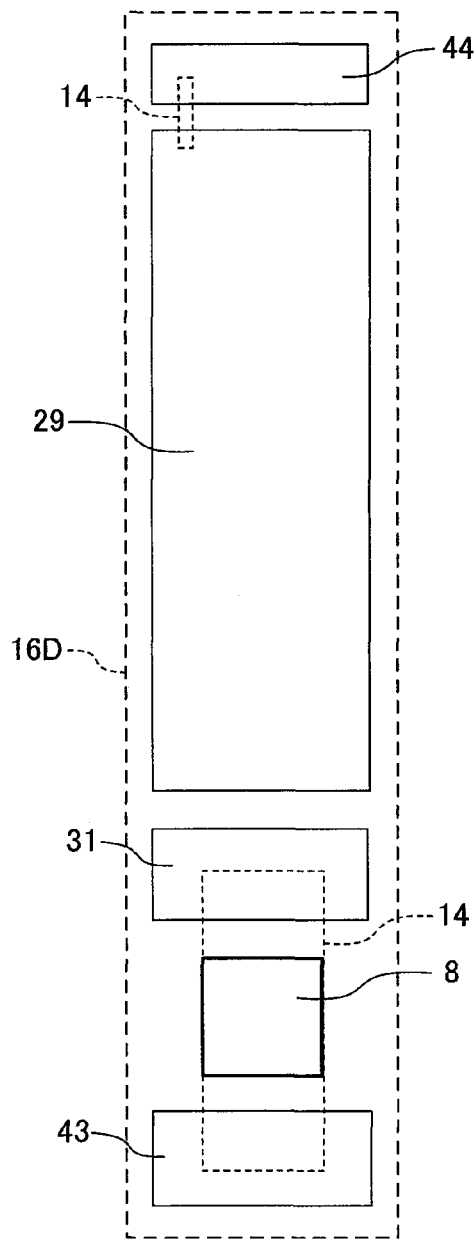
FIGS. 15A and 15B are enlarged plan views each showing an output circuit cell according to Embodiment 4 of the present invention.
Figure 15B:
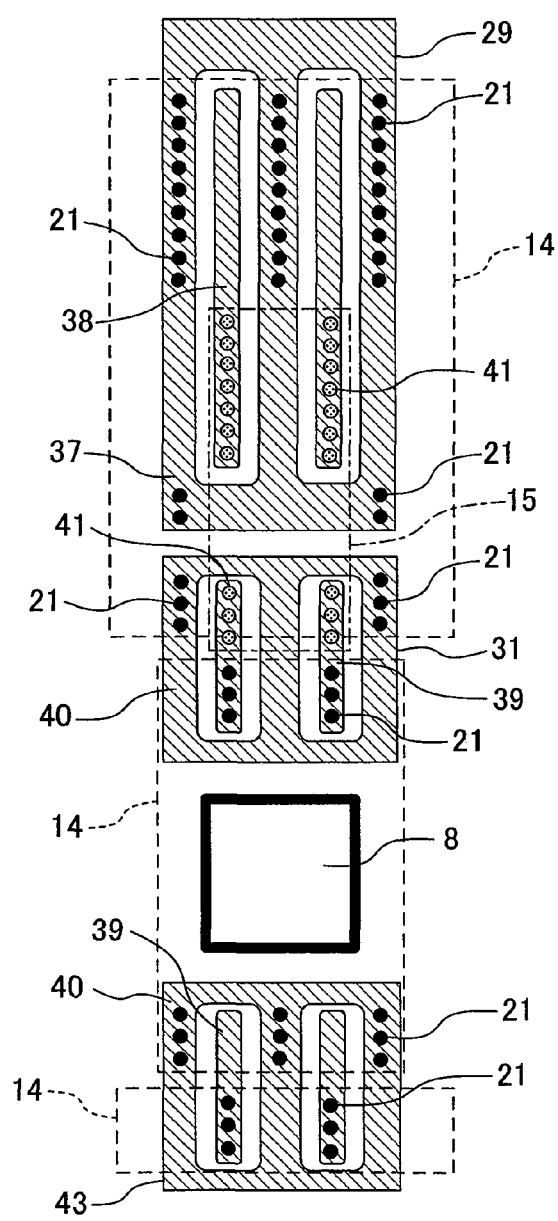

Each output circuit cell 16D is composed of the pad 8, the low-side transistor 29, the low-side regenerative diode 31, the pre-driver 44, and the ESD protection device 43 which are arranged in alignment with each other along a straight line, wherein centering on the pad 8, the low-side regenerative diode 31, the low-side transistor 29, and the pre-driver 44 are sequentially arranged on one side toward the low breakdown voltage control portion 6, and the ESD protection device 43 is arranged on the other side. It is to be noted that a timing control signal from the low breakdown voltage control portion 6 is transmitted to the pre-drivers 44 through the bus interconnects 7. Moreover, components in each output circuit cell 16D are connected by a two-layer interconnect 14 or a one-layer interconnect as shown in FIGS. 15A and 15B. In FIG. 15B, through holes 21, contacts 41, an emitter region 37 of the low-side transistor 29, a corrector region 38 of the low-side transistor 29, a cathode region 39 of the low-side diode 31 and the ESD protection device 43, and an anode region 40 of the low-side diode 31 and the ESD protection device 43 are shown.

As mentioned above, the ESD protection device 43 and the low-side regenerative diode 31 also serving as an ESD protection device in consideration of improving the ESD tolerance are arranged with the pad 8 interposed therebetween. Thus, the effect of ESD protection can be enhanced. Moreover, the pre-driver 44 is designed to have a cell width smaller than or equal to that of the low-side transistor 29, where the low-side transistor 29 has the largest cell width, so that the high integration can be realized.

Moreover, among the plurality of output circuit cells 16D, one or more output circuit cells 16D (in FIG. 14, four output circuit cells) in the vicinity of end portions of the chip sides of the semiconductor chip 1 (at corners of the semiconductor chip 1) are arranged having a steplike shift in a direction apart from the chip sides with decreasing distance from a center portion to the end portions of the chip sides. Meanwhile, among the plurality of output circuit cells 16D, one or more output circuit cells in the center portion of the chip sides of the semiconductor chip 1 (in FIG. 14, standard cells excepting the four output circuit cells at each corner) are evenly arranged along the chip sides without being shifted.

Figure 16:
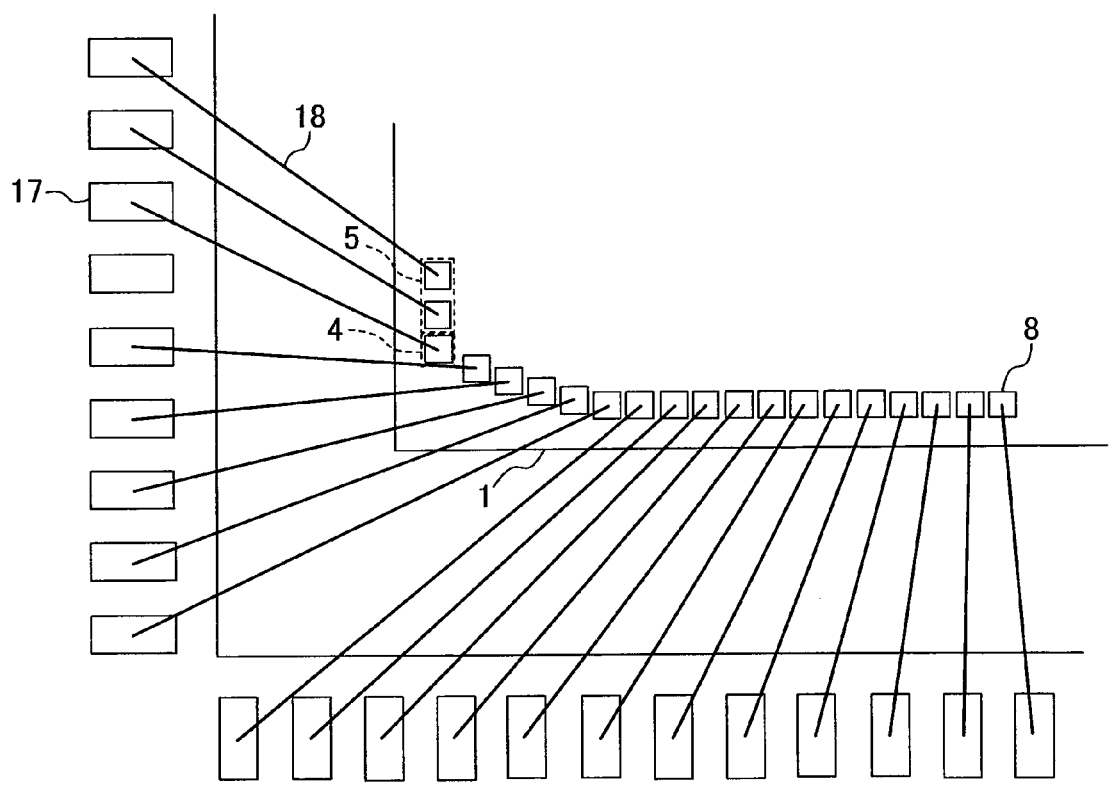
FIG. 16 is a plan view showing how wires are bonded in the semiconductor integrated circuit according to Embodiment 4 of the present invention.

That is, as shown in FIG. 16 which is an enlarged view showing how wires are bonded in the multi-channel semiconductor integrated circuit of the present embodiment, to prevent bonding wires 18 connecting the pads 8 with inner leads 17 from being in contact with each other, the pads 8 included in the output circuit cells 16D in the vicinity of the corners of the semiconductor chip 1 are arranged having a steplike shift as described above, and the pads 8 in the other portions of the semiconductor chip 1 are evenly arranged without being shifted.

With this layout, enhancement of reliability as to assembly can be realized. That is, even if the number of output circuit cells 16D or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3a are formed such that each of the interconnects 3a lies over the low-side transistors 29 in the output circuit cells 16D and is connected to the reference potential pads 5 arranged on both the ends of the plurality of output circuit cells 16D.

In the same manner, high voltage potential interconnects 2 are formed such that each of the high voltage potential interconnects 2 lies over the ESD protection devices 43 in the output circuit cells 16D and is connected to the high voltage power source pads 4 arranged on both the ends of the plurality of output circuit cells 16D. Here, as described above, the plurality of output circuit cells 16D is stepwise arranged in the vicinity of the corners of the semiconductor chip 1. Therefore, by making use of this layout, the width of each high voltage potential interconnect 2 is expanded in the vicinity of the corners so that portions on which a load current from the pads 8 concentrates are wide. Thus, it is possible to reduce an interconnect resistance to the high voltage power source pads 4 on which the load current from the pads 8 concentrates. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16D on the semiconductor chip 1, potentials of the reference potential pads 5 and the high voltage power source pads 4 are stable. Therefore, it is possible to reduce the interconnect impedance of each of the reference potential interconnects 3a and the high voltage potential interconnects 2. Moreover, even when large currents are output from respective channels, the reference potential and the high voltage potential of each of the output circuit cells 16D are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3b is arranged to surround three sides excepting the side where the input control pad 9 is arranged. The reference potential interconnect 3b serves as a shield which prevents an outer noise input from the pads 8 from being transmitted to the low breakdown voltage control portion 6 via the output control cells 16D. Therefore, a signal input from the low breakdown voltage control portion 6 to the pre-drivers 44 is stabilized, which makes the output characteristics uniform. It is to be noted that as the output circuit cells 16D in the vicinity of the corners of the semiconductor chip 1 are arranged having a steplike shift, the low breakdown voltage control portion 6 is likewise formed to have a steplike shape at four corners corresponding to the corners of the semiconductor chip 1.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 44. Therefore, in the present embodiment, the bus interconnects 7 connecting the pre-drives 44 with the low breakdown voltage control portion 6 have substantially the same length. Therefore, the delay times are made uniform to prevent the output characteristics from being unbalanced due to the difference in delay time between output channels.

Embodiment 5

Figure 17:
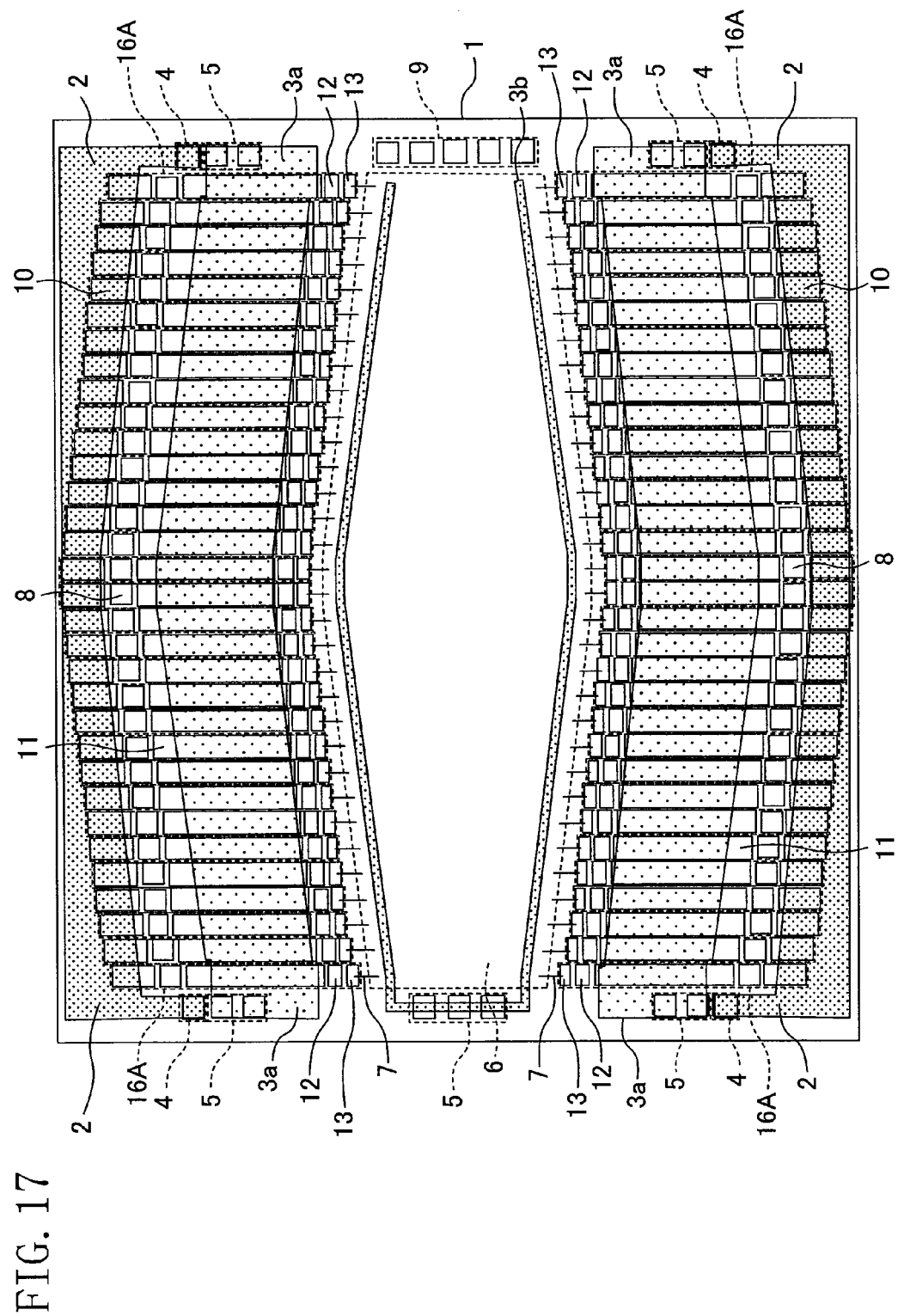
FIG. 17 is a plan view showing a layout of a semiconductor integrated circuit according to Embodiment 5 of the present invention.

FIG. 17 is a plan view illustrating a layout of a multi-channel semiconductor integrated circuit of Embodiment 5 of the present invention. Specifically, descriptions are given taking a multi-channel semiconductor integrated circuit provided with output circuits 25a each including the MOS driver 45 of FIG. 1 mentioned above as an example.

As shown in FIG. 17, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16A is arranged along chip sides to face each other with the low breakdown voltage control portion 6 interposed therebetween. Each of the plurality of circuit cells 16A has the configuration of the output circuit 25a of FIG. 1. The low breakdown voltage control portion 6 is connected to the output circuit cells 16A via bus interconnects 7. Moreover, high voltage power source pads 4 are arranged on both ends of the plurality of output circuit cells 16A, and reference potential pads 5 are arranged on both the ends of the plurality of output circuit cells 16A.

Each output circuit cell 16A is composed of the pad 8, the high-side transistor 10, the low-side transistor 11, the level shift circuit 12, and the pre-driver 13 which are arranged in alignment with each other along a straight line, wherein centering on the pad 8, the low-side transistor 11, the level shift circuit 12, and the pre-driver 13 are sequentially arranged on one side toward the low breakdown voltage control portion 6, and the high-side transistor 10 is arranged on the other side. It is to be noted that a timing control signal from the low breakdown voltage control portion 6 is transmitted to the pre-drivers 13 through the bus interconnects 7. Moreover, a specific configuration of each output circuit cell 16A is as shown in FIGS. 6A and 6B described above.

As mentioned above, the high-side transistor 10 including the back gate-drain parasitic diode 26 and the low-side transistor 11 including the back gate-drain parasitic diode 27 are arranged with the pad 8 interposed therebetween, the back gate-drain parasitic diode 26 and the back gate-drain parasitic diode 27 also serving as ESD protection devices in consideration of improving the ESD tolerance. Thus, the effect of ESD protection can be enhanced. Moreover, each of the level shift circuit 12 and the pre-driver 13 is designed to have a cell width smaller than or equal to that of the low-side transistor 11, where the low-side transistor 11 has the largest cell width, so that the high integration can be realized.

Moreover, the plurality of output circuit cells 16A is arranged having a steplike shift in a direction apart from the chip sides of the semiconductor chip 1 with decreasing distance from a center portion to the end portions of the chip sides.

Figure 18:
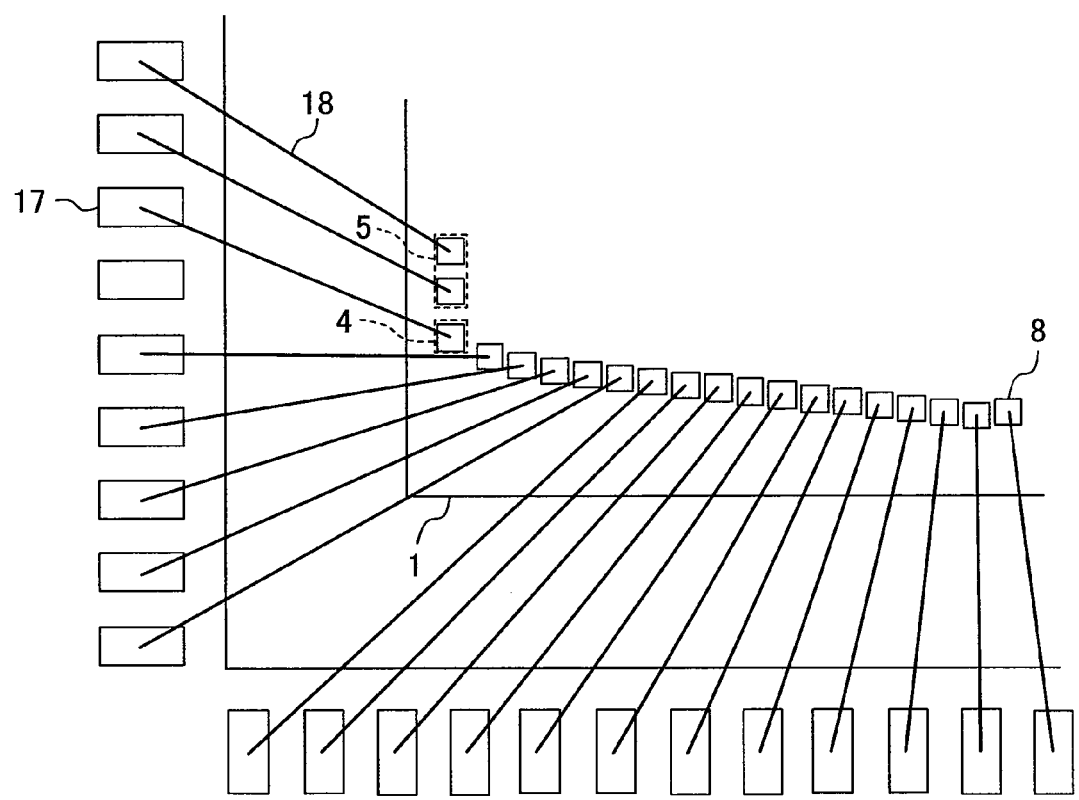
FIG. 18 is an enlarged plan view showing how wires are bonded in the semiconductor integrated circuit according to Embodiment 5 of the present invention.

That is, as shown in FIG. 18 which is an enlarged view showing how wires are bonded in the multi-channel semiconductor integrated circuit of the present embodiment, to prevent bonding wires 18 connecting the pads 8 with inner leads 17 from being in contact with each other, the pads 8 are arranged having a steplike shift in a direction apart from the chip sides with decreasing distance from the center portion to the end portions of the chip sides.

With this layout, enhancement of reliability as to assembly can be realized. That is, even if the number of output circuit cells 16A or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3a are formed such that each of the interconnects 3a lies over the low-side transistors 11 in the output circuit cells 16A and is connected to the reference potential pads 5 arranged on both the ends of the plurality of output circuit cells 16A.

In the same manner, high voltage potential interconnects 2 are formed such that each of the high voltage potential interconnects 2 lies over the high-side transistors 10 in the output circuit cells 16A and is connected to the high voltage power source pads 4 arranged on both the ends of the plurality of output circuit cells 16A. Here, as described above, the plurality of output circuit cells 16A is arranged having a steplike shift in a direction apart from the chip sides of the semiconductor chip 1 with decreasing distance from the center portion to the end portions of the chip sides. Therefore, by making use of this layout, the width of each high voltage potential interconnect 2 is expanded with decreasing distance from its center portion to end portions so that portions on which a load current from the pads 8 more concentrates are wide. Thus, an interconnect resistance from the center portion of the interconnect 2 to the high voltage source pads 4 can be made uniform. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16A on the semiconductor chip 1, potentials of the reference potential pads 5 and the high voltage power source pads 4 are stable. Therefore, it is possible to reduce the interconnect impedance of each of the reference potential interconnects 3a and the high voltage potential interconnects 2. Moreover, even when large currents are output from respective channels, the reference potential and the high voltage potential of each of the output circuit cells 16A are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3b is arranged to surround three sides excepting the side where the input control pad 9 is arranged. The reference potential interconnect 3b serves as a shield which prevents an outer noise input from the pads 8 from being transmitted to the low breakdown voltage control portion 6 via the output control cells 16A. Therefore, a signal input from the low breakdown voltage control portion 6 to the pre-drivers 13 is stabilized, which makes the output characteristics uniform. It is to be noted that as the output circuit cells 16A are arranged having a steplike shift in a direction apart from the chip sides of the semiconductor chip 1 with decreasing distance from the center portion to the end portions of the chip sides, the low breakdown voltage control portion 6 is formed to have a slope shift in a direction apart from the chip sides from the center portion toward the end portions of the chip sides.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 13. Therefore, in the present embodiment, the bus interconnects 7 connecting the pre-drives 13 with the low breakdown voltage control portion 6 have substantially the same length. Therefore, the delay times are made uniform to prevent the output characteristics from being unbalanced due to the difference in delay time between output channels.

Variations

Figure 19:
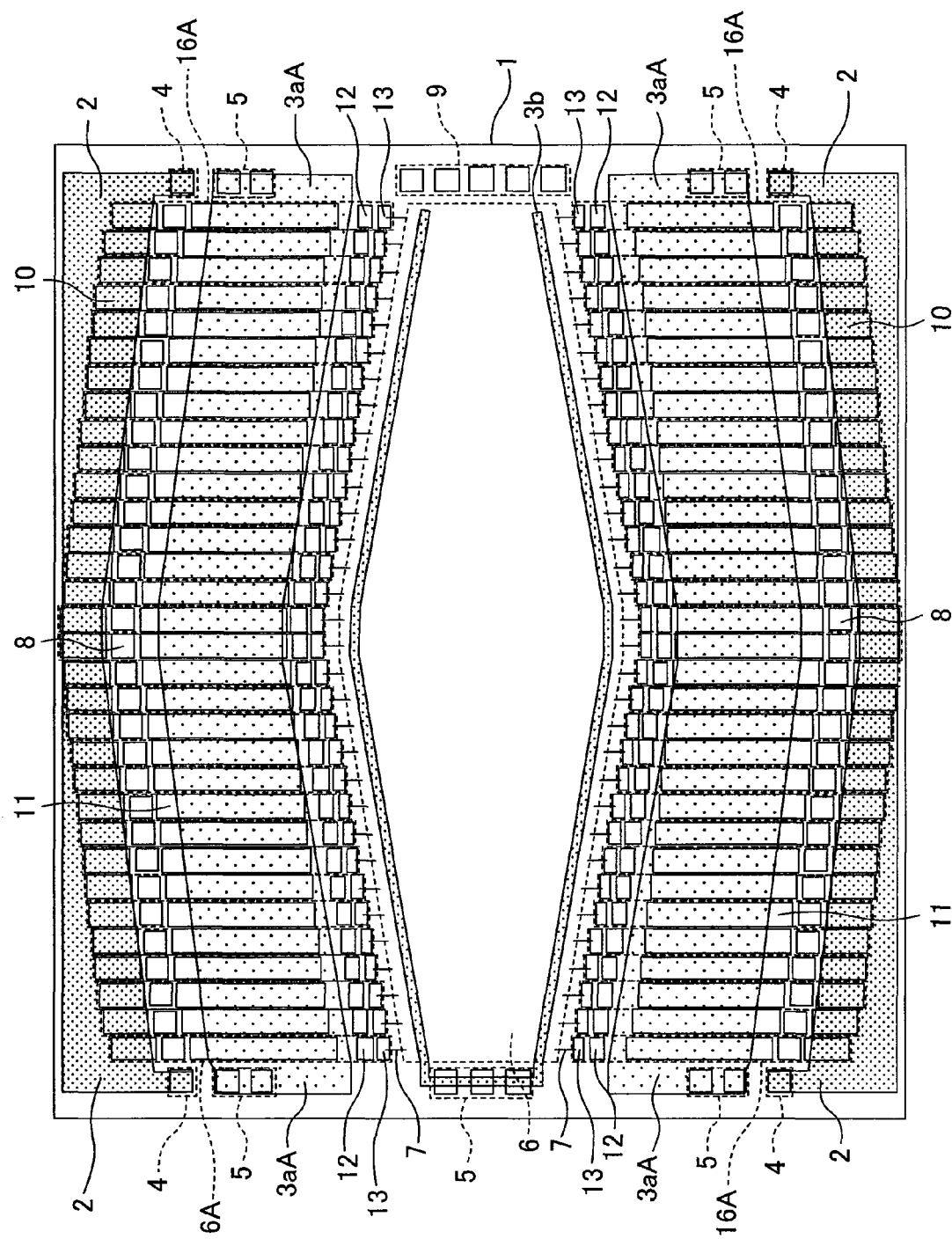
FIG. 19 is a plan view showing a layout of a variation of the semiconductor integrated circuit according to Embodiment 5 of the present invention.

FIG. 19 is a plan view illustrating a layout of a variation of the semiconductor integrated circuit according to Embodiment 5 of the present invention.

As shown in FIG. 19, the variation of the semiconductor integrated circuit according to the present embodiment is characterized by the shape of reference potential interconnects 3aA formed over the low-side transistors 11 in the output circuit cells 16A. Specifically, as the high voltage potential interconnects 2, the width of each reference potential interconnect 3aA is expanded with decreasing distance from the center portion to the end portions of the interconnect 3aA so that portions on which a load current from the pads 8 more concentrates are wide. Thus, an interconnect resistance from the center portion of the interconnect 3aA to the reference potential pads 5 can also be made uniform. Therefore, a variation in ESD tolerance is suppressed and a variation in ON resistance between outputs due to the difference between voltage drops is reduced, so that output characteristics can be made uniform.

In FIG. 19, descriptions have been given of the configuration in which the width of each reference potential interconnect 3aA as well as the width of each high voltage potential interconnect 2 are expanded with decreasing distance from the center portion to the end portions. However, a configuration may be acceptable in which the width of each high voltage potential interconnect 2 is constant, and only the width of each reference potential interconnect 3aA is formed to have the above-mentioned shape.

Embodiment 6

Figure 20:
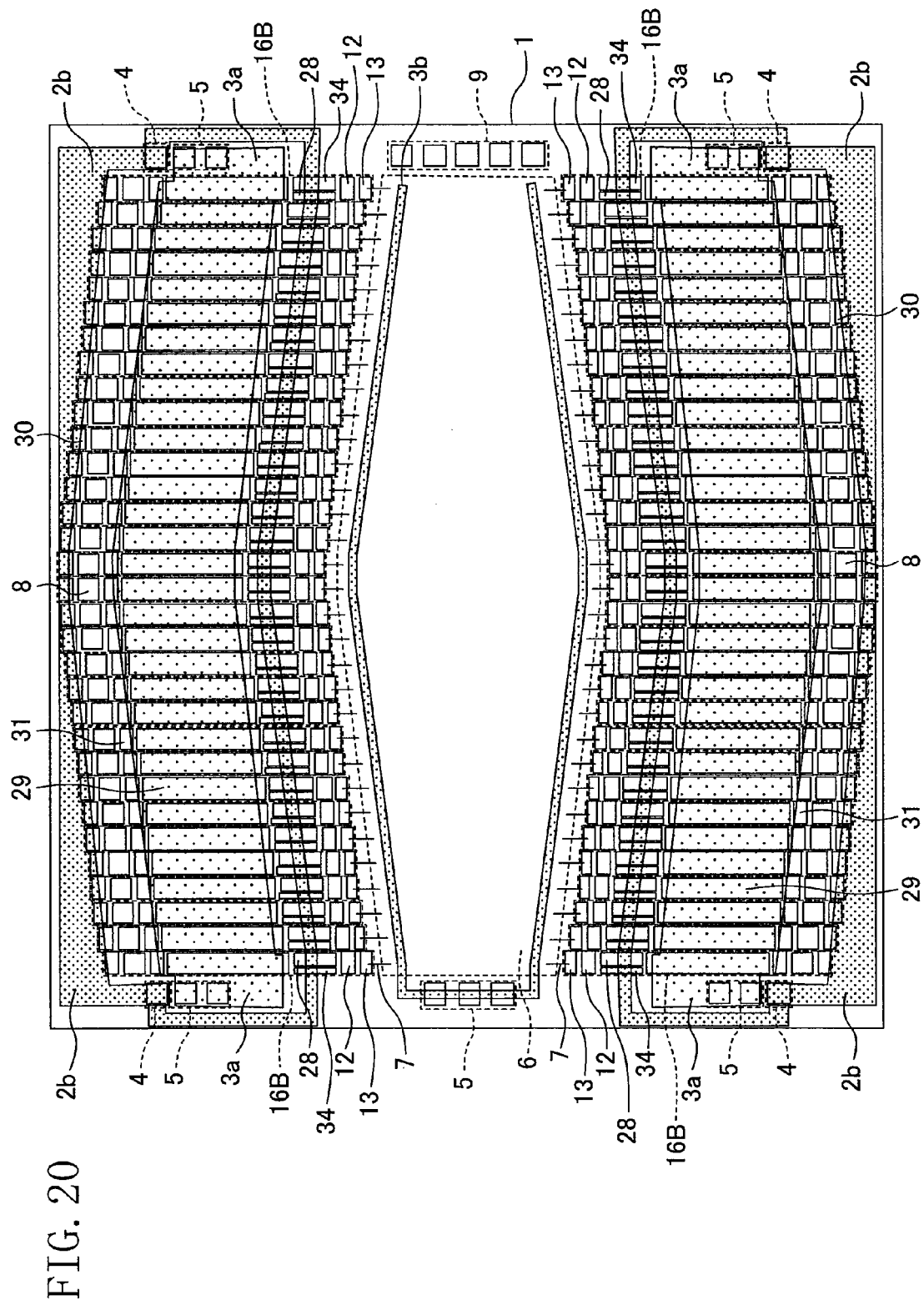
FIG. 20 is a plan view showing a layout of a semiconductor integrated circuit according to Embodiment 6 of the present invention.

FIG. 20 is a plan view illustrating a layout of a multi-channel semiconductor integrated circuit of Embodiment 6 of the present invention. Specifically, descriptions are given taking a multi-channel semiconductor integrated circuit provided with output circuits 25b each including the IGBT driver 46 of FIG. 2 mentioned above as an example.

As shown in FIG. 20, a low breakdown voltage control portion 6 is arranged in the center of a semiconductor chip 1.

The low breakdown voltage control portion 6 controls output timing by an input control circuit or the like. Moreover, on the semiconductor chip 1, a plurality of output circuit cells 16B is arranged along chip sides to face each other with the low breakdown voltage control portion 6 interposed therebetween. Each of the plurality of circuit cells 16B has the configuration of the output circuit 25b of FIG. 2. The low breakdown voltage control portion 6 is connected to the output circuit cells 16B via bus interconnects 7. Moreover, high voltage power source pads 4 are arranged on both ends of the plurality of output circuit cells 16B, and reference potential pads 5 are arranged on both the ends of the plurality of output circuit cells 16B.

Each output circuit cell 16B is composed of the pad 8, the high-side transistor 28, the low-side transistor 29, the high-side regenerative diode 30, the low-side regenerative diode 31, the level shift circuit 12, and the pre-driver 13 which are arranged in alignment with each other along a straight line, wherein centering on the pad 8, the low-side regenerative diode 31, the low-side transistor 29, the high-side transistor 28, the gate protection circuit 34, the level shift circuit 12, and the pre-driver 13 are sequentially arranged on one side toward the low breakdown voltage control portion 6, and the high-side regenerative diode 30 is arranged on the other side. It is to be noted that a timing control signal from the low breakdown voltage control portion 6 is transmitted to the pre-drivers 13 through the bus interconnects 7. Moreover, a specific configuration of each output circuit cell 16B is as shown in FIGS. 9A and 9B described above.

As mentioned above, the high-side regenerative diode 30 also serving as an ESD protection device in consideration of improving the ESD tolerance and the low-side regenerative diode 31 are arranged with the pad 8 interposed therebetween. Thus, the effect of ESD protection can be enhanced. Moreover, each of the level shift circuit 12 and the pre-driver 13 is designed to have a cell width smaller than or equal to that of the low-side transistor 29, where the low-side transistor 29 has the largest cell width, so that the high integration can be realized.

Moreover, the plurality of output circuit cells 16B is arranged having a steplike shift in a direction apart from the chip sides of the semiconductor chip 1 with decreasing distance from a center portion to the end portions of the chip sides.

Figure 21:
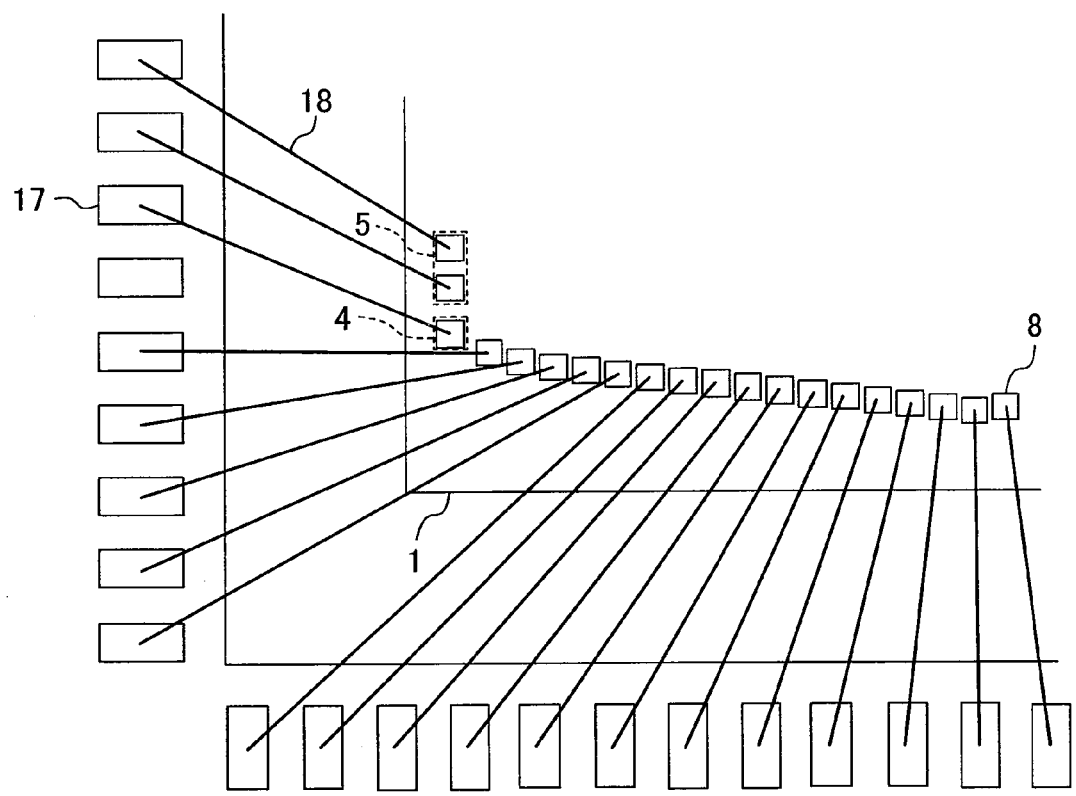
FIG. 21 is a view showing how wires are bonded in the semiconductor integrated circuit according to Embodiment 6 of the present invention.

That is, as shown in FIG. 21 which is an enlarged view showing how wires are bonded in the multi-channel semiconductor integrated circuit of the present embodiment, to prevent bonding wires 18 connecting the pads 8 with inner leads 17 from being in contact with each other, the pads 8 are arranged having a steplike shift in a direction apart from the chip sides with decreasing distance from the center portion to the end portions of the chip sides.

With this layout, enhancement of reliability as to assembly can be realized. That is, even if the number of output circuit cells 16B or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3a are formed such that each of the interconnects 3a lies over the low-side transistors 29 and the low-side regenerative diodes 31 in the output circuit cells 16B and is connected to the reference potential pads 5 arranged on both the ends of the plurality of output circuit cells 16B.

In the same manner, high voltage potential interconnects 2b are formed such that each of the high voltage potential interconnects 2b lies over the high-side transistors 28 and the high-side regenerative diodes 30 in the output circuit cells 16B and is connected to the high voltage power source pads 4 arranged on both the ends of the plurality of output circuit cells 16B. Here, as described above, the plurality of output circuit cells 16B is arranged having a steplike shift in a direction apart from the chip sides of the semiconductor chip 1 with decreasing distance from the center portion to the end portions of the chip sides. Therefore, by making use of this layout, the width of each high voltage potential interconnect 2b is expanded with decreasing distance from its center portion to end portions so that portions on which a load current from the pads 8 more concentrates are wide. Thus, an interconnect resistance from the center portion of the interconnect 2b to the high voltage source pads 4 can be made uniform. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16B on the semiconductor chip 1, potentials of the reference potential pads 5 and the high voltage power source pads 4 are stable. Therefore, it is possible to reduce the interconnect impedance of each of the reference potential interconnects 3a and the high voltage potential interconnects 2b. Moreover, even when large currents are output from respective channels, the reference potential and the high voltage potential of each of the output circuit cells 16B are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3b is arranged to surround three sides excepting the side where the input control pad 9 is arranged. The reference potential interconnect 3b serves as a shield which prevents an outer noise input from the pads 8 from being transmitted to the low breakdown voltage control portion 6 via the output control cells 16B. Therefore, a signal input from the low breakdown voltage control portion 6 to the pre-drivers 13 is stabilized, which makes the output characteristics uniform. It is to be noted that as the output circuit cells 16B are arranged having a steplike shift in a direction apart from the chip sides of the semiconductor chip 1 with decreasing distance from the center portion to the end portions of the chip sides, the low breakdown voltage control portion 6 is formed to have a slope shift in a direction apart from the chip sides from the center portion toward the end portions of the chip sides.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 13. Therefore, in the present embodiment, the bus interconnects 7 connecting the pre-drives 13 with the low breakdown voltage control portion 6 have substantially the same length. Therefore, the delay times are made uniform to prevent the output characteristics from being unbalanced due to the difference in delay time between output channels.

Variations

Figure 22:
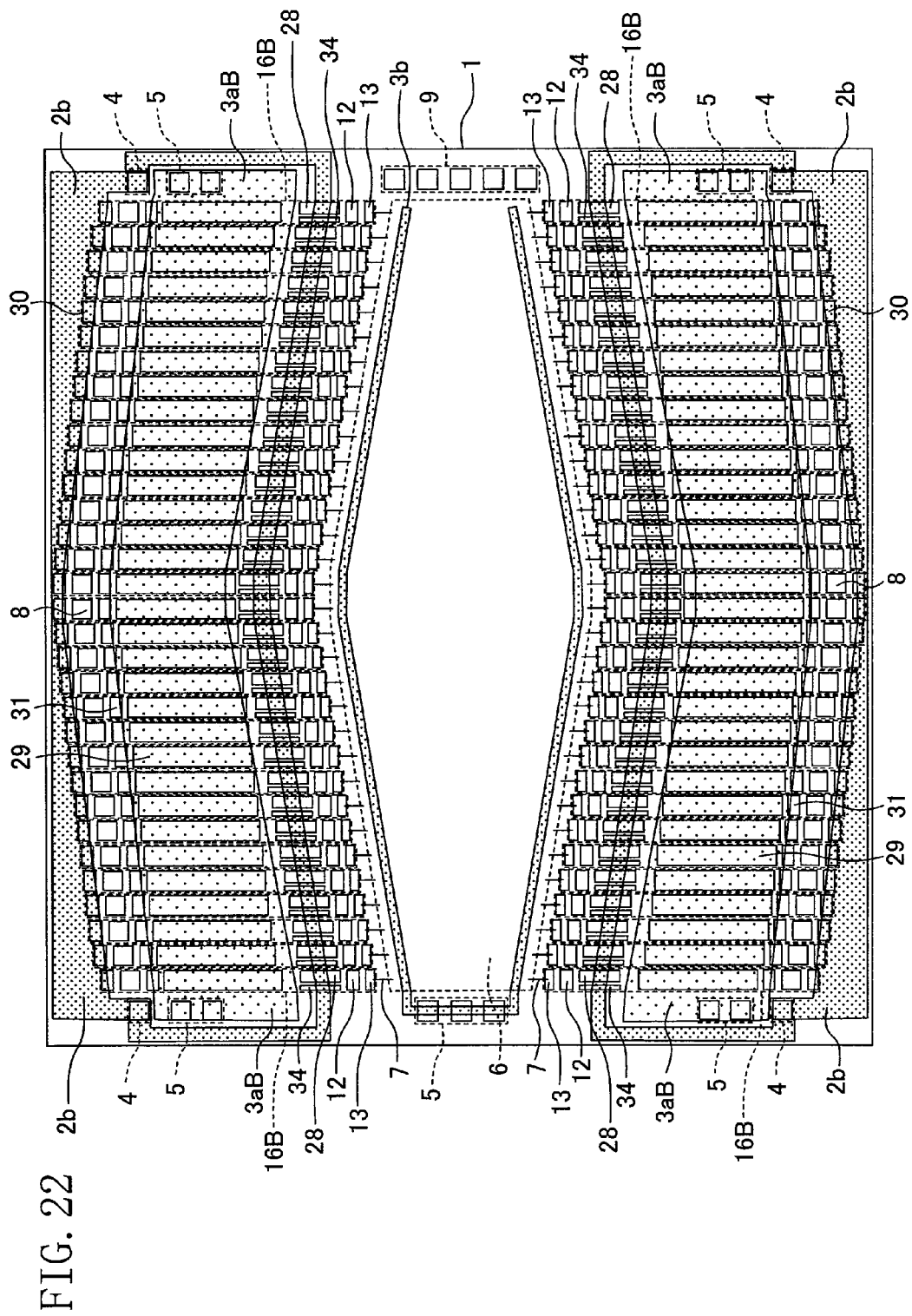
FIG. 22 is a plan view showing a layout of a variation of the semiconductor integrated circuit according to Embodiment 6 of the present invention.

FIG. 22 is a plan view illustrating a layout of a variation of the semiconductor integrated circuit according to Embodiment 6 of the present invention.

As shown in FIG. 22, the variation of the semiconductor integrated circuit according to the present embodiment is characterized by the shape of reference potential interconnects 3aB formed over the low-side transistors 29 and the low-side regenerative diodes 31 in the output circuit cells 16B. Specifically, as the high voltage potential interconnects 2b, the width of each reference potential interconnect 3aB is expanded with decreasing distance from the center portion to the end portions of the interconnect 3aB so that portions on which a load current from the pads 8 more concentrates are wide. Thus, an interconnect resistance from the center portion of the interconnect 3aB to the reference potential pads 5 can also be made uniform. Therefore, a variation in ESD tolerance is suppressed and a variation in ON resistance between outputs due to the difference between voltage drops is reduced, so that output characteristics can be made uniform.

In FIG. 22, descriptions have been given of the configuration in which the width of each reference potential interconnect 3aB as well as the width of each interconnect 2b for the high voltage potential are expanded with decreasing distance from the center portion to the end portions. However, a configuration may be acceptable in which the width of each high voltage potential interconnect 2b is constant, and only the width of each reference potential interconnect 3aB is formed to have the above-mentioned shape.

Embodiment 7

Figure 23:
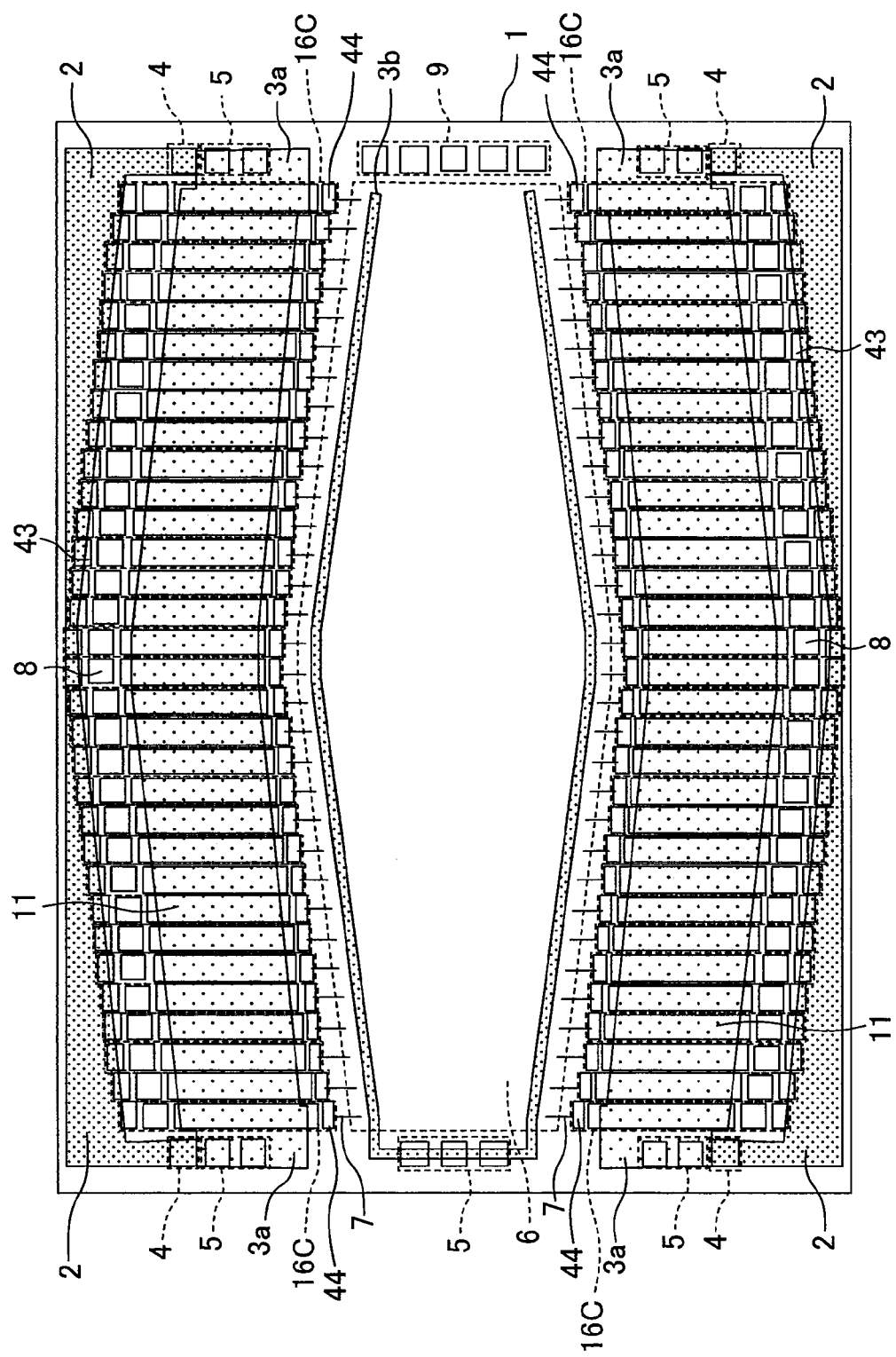
FIG. 23 is a plan view showing a layout of a semiconductor integrated circuit according to Embodiment 7 of the present invention.

FIG. 23 is a plan view illustrating a layout of a multi-channel semiconductor integrated circuit of Embodiment 7 of the present invention. Specifically, descriptions are given taking a multi-channel semiconductor integrated circuit provided with output circuits 25c each including the high-sideless MOS driver 47 of FIG. 3 mentioned above as an example.

As shown in FIG. 23, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16C is arranged along chip sides to face each other with the low breakdown voltage control portion 6 interposed therebetween. Each of the plurality of circuit cells 16C has the configuration of the output circuit 25c of FIG. 3. The low breakdown voltage control portion 6 is connected to the output circuit cells 16C via bus interconnects 7. Moreover, high voltage power source pads 4 are arranged on both ends of the plurality of output circuit cells 16C, and reference potential pads 5 are arranged on both the ends of the plurality of output circuit cells 16C.

Each output circuit cell 16C is composed of the pad 8, the low-side transistor 11, the pre-driver 44, and the ESD protection device 43 which are arranged in alignment with each other along a straight line, wherein centering on the pad 8, the low-side transistor 11 and the pre-driver 44 are sequentially arranged on one side toward the low breakdown voltage control portion 6, and the ESD protection device 43 is arranged on the other side. It is to be noted that a timing control signal from the low breakdown voltage control portion 6 is transmitted to the pre-drivers 44 through the bus interconnects 7.

Moreover, a specific configuration of each output circuit cell 16C is as shown in FIGS. 12A and 12B described above.

As mentioned above, the ESD protection device 43 and the low-side transistor 11 including the back gate-drain parasitic diode 27 are arranged with the pad 8 interposed therebetween, the back gate-drain parasitic diode 27 also serving as an ESD protection device in consideration of improving the ESD tolerance. Thus, the effect of ESD protection can be enhanced. Moreover, the pre-driver 44 is designed to have a cell width smaller than or equal to that of the low-side transistor 11, where the low-side transistor 11 has the largest cell width, so that the high integration can be realized.

Moreover, the plurality of output circuit cells 16C is arranged having a steplike shift in a direction apart from the chip sides of the semiconductor chip 1 with decreasing distance from a center portion to the end portions of the chip sides.

Figure 24:
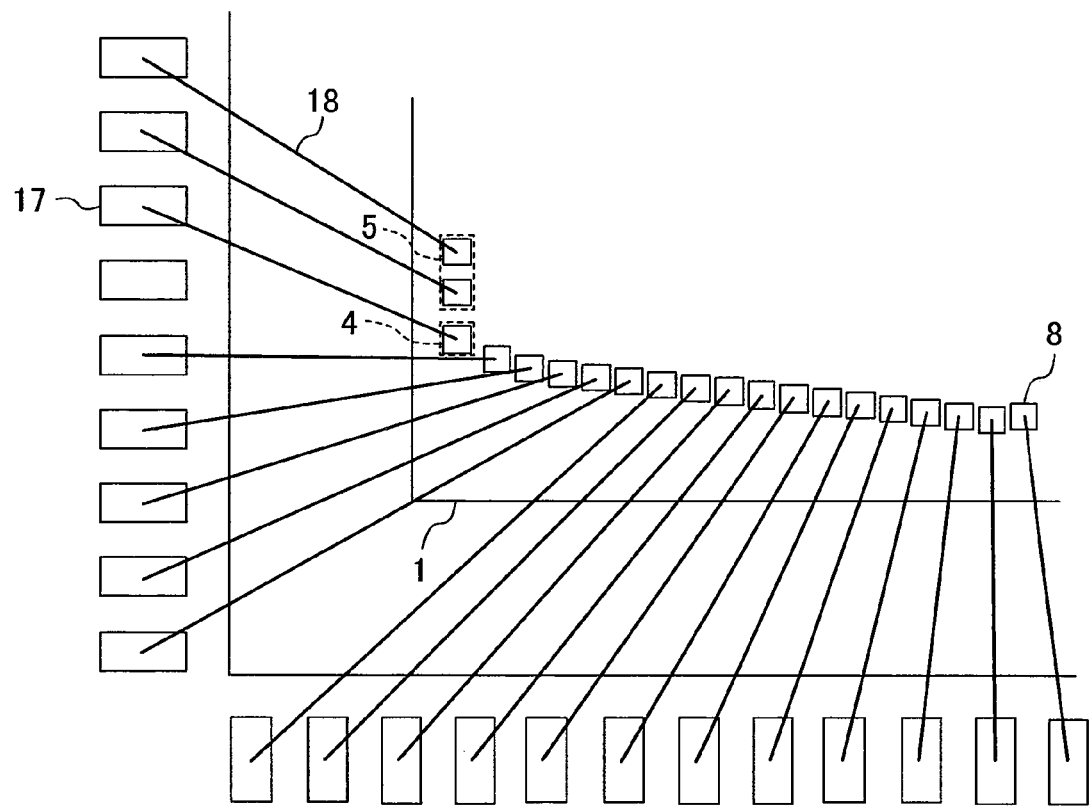
FIG. 24 is a plan view showing how wires are bonded in the semiconductor integrated circuit according to Embodiment 7 of the present invention.

That is, as shown in FIG. 24 which is an enlarged view showing how wires are boned in the multi-channel semiconductor integrated circuit of the present embodiment, to prevent bonding wires 18 connecting the pads 8 with inner leads 17 from being in contact with each other, the pads 8 in the output circuit cells 16C are arranged having a steplike shift in a direction apart from the chip sides with decreasing distance from the center portion to the end portions of the chip sides.

With this layout, enhancement of reliability as to assembly can be realized. That is, even if the number of output circuit cells 16C or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3a are formed such that each of the interconnects 3a lies over the low-side transistors 11 in the output circuit cells 16C and is connected to the reference potential pads 5 arranged on both the ends of the plurality of output circuit cells 16C.

In the same manner, high voltage potential interconnects 2 are formed such that each of the high voltage potential interconnects 2 lies over the ESD protection devices 43 in the output circuit cells 16C and is connected to the high voltage power source pads 4 arranged on both the ends of the plurality of output circuit cells 16C. Here, as described above, the plurality of output circuit cells 16C is arranged having a steplike shift in a direction apart from the chip sides of the semiconductor chip 1 with decreasing distance from the center portion to the end portions of the chip sides. Therefore, by making use of this layout, the width of each high voltage potential interconnect 2 is expanded with decreasing distance from its center portion to end portions so that portions on which a load current from the pads 8 more concentrates are wide. Thus, an interconnect resistance from the center portion of the interconnect 2 to the high voltage source pads 4 can be made uniform. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16C on the semiconductor chip 1, potentials of the reference potential pads 5 and the high voltage power source pads 4 are stable. Therefore, it is possible to reduce the interconnect impedance of each of the reference potential interconnects 3a and the high voltage potential interconnects 2. Moreover, even when large currents are output from respective channels, the reference potential and the high voltage potential of each of the output circuit cells 16C are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3b is arranged to surround three sides excepting the side where the input control pad 9 is arranged. The reference potential interconnect 3b serves as a shield which prevents an outer noise input from the pads 8 from being transmitted to the low breakdown voltage control portion 6 via the output control cells 16C. Therefore, a signal input from the low breakdown voltage control portion 6 to the pre-drivers 44 is stabilized, which makes the output characteristics uniform. It is to be noted that as the output circuit cells 16C are arranged having a steplike shift in a direction apart from the chip sides of the semiconductor chip 1 with decreasing distance from the center portion to the end portions of the chip sides, the low breakdown voltage control portion 6 is formed to have a slope shift in a direction apart from the chip sides from the center portion toward the end portions of the chip sides.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 44. Therefore, in the present embodiment, the bus interconnects 7 connecting the pre-drives 44 with the low breakdown voltage control portion 6 have substantially the same length. Therefore, the delay times are made uniform to prevent the output characteristics from being unbalanced due to the difference in delay time between output channels.

Variations

Figure 25:
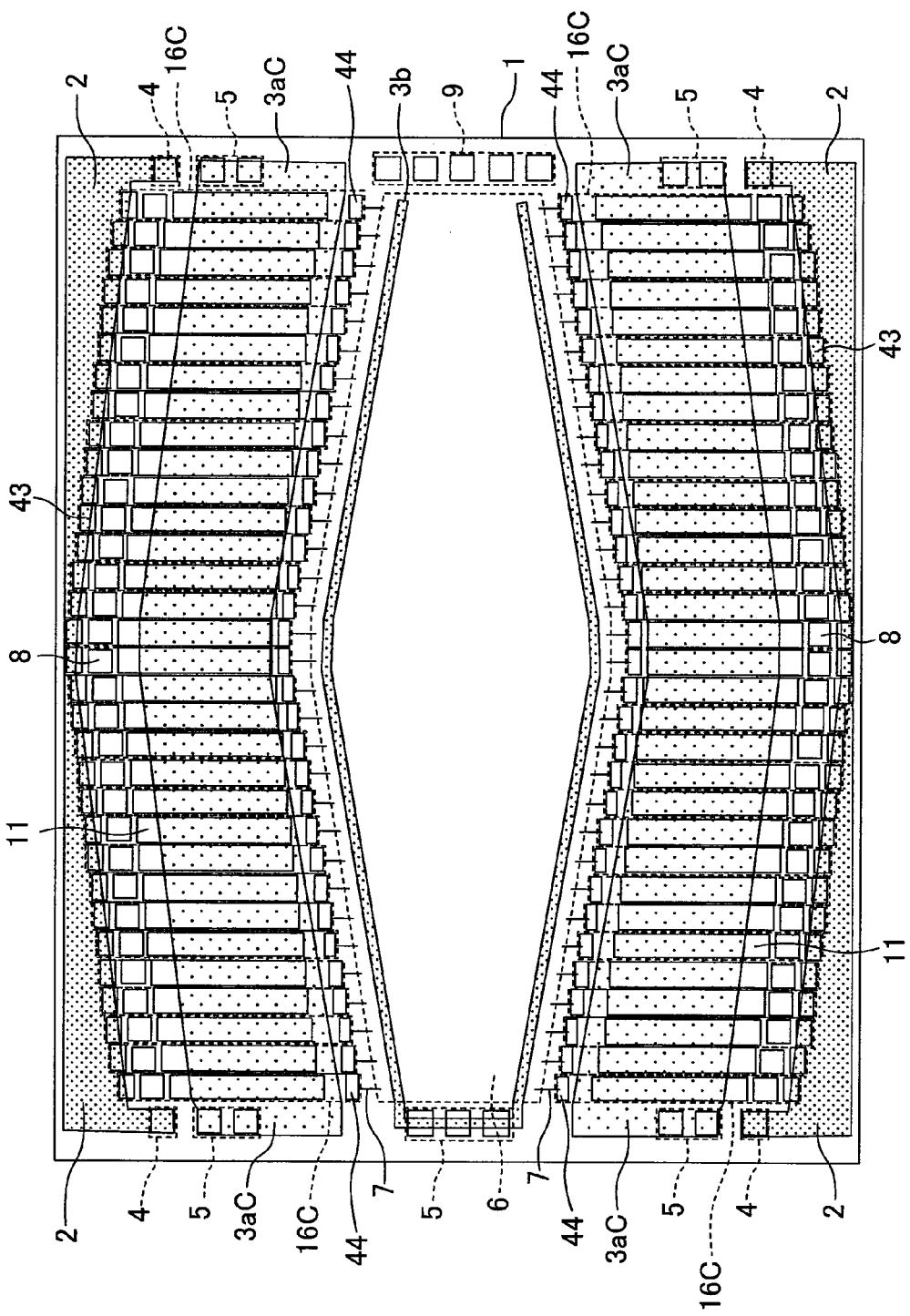
FIG. 25 is a plan view showing a layout of a variation of the semiconductor integrated circuit according to Embodiment 7 of the present invention.

FIG. 25 is a plan view illustrating a layout of a variation of the semiconductor integrated circuit according to Embodiment 7 of the present invention.

As shown in FIG. 25, the variation of the semiconductor integrated circuit according to the present embodiment is characterized by the shape of reference potential interconnects 3aC formed over the low-side transistors 11 in the output circuit cells 16C. Specifically, as the high voltage potential interconnects 2, the width of each reference potential interconnect 3aC is expanded with decreasing distance from the center portion to the end portions of the interconnect 3aC so that portions on which a load current from the pads 8 more concentrates are wide. Thus, an interconnect resistance from the center portion of the interconnect 3aC to the reference potential pads 5 can also be made uniform. Therefore, a variation in ESD tolerance is suppressed and a variation in ON resistance between outputs due to the difference between voltage drops is reduced, so that output characteristics can be made uniform.

In FIG. 25, descriptions have been given of the configuration in which the width of each reference potential interconnect 3aC as well as the width of each high voltage potential interconnect 2 are expanded with decreasing distance from the center portion to the end portions. However, a configuration may be acceptable in which the width of each high voltage potential interconnect 2 is constant, and only the width of each reference potential interconnect 3aC is formed to have the above-mentioned shape.

Embodiment 8

Figure 26:
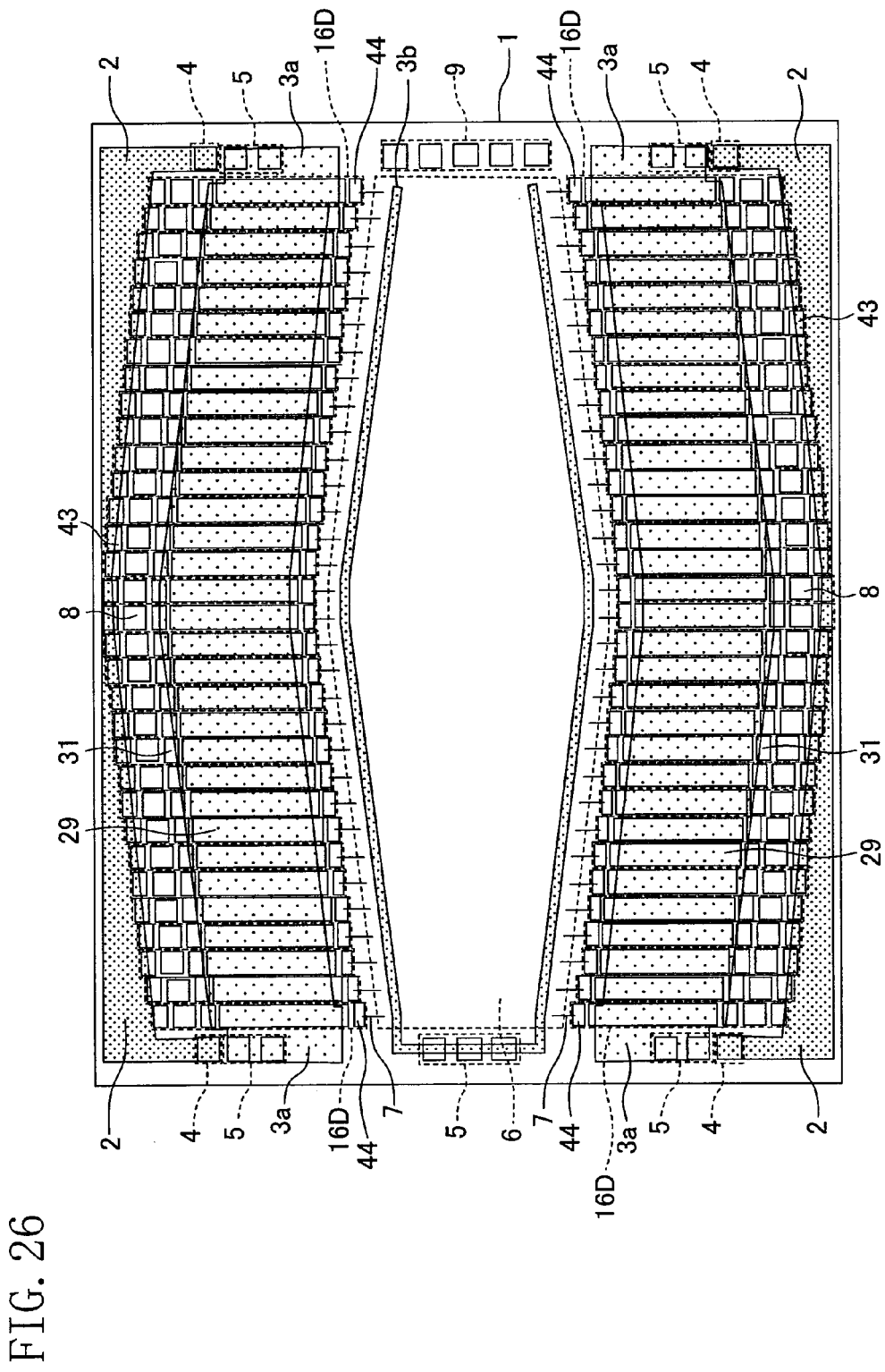
FIG. 26 is a plan view showing a layout of a semiconductor integrated circuit according to Embodiment 8 of the present invention.

FIG. 26 is a plan view illustrating a layout of a multi-channel semiconductor integrated circuit of Embodiment 8 of the present invention. Specifically, descriptions are given taking a multi-channel semiconductor integrated circuit provided with output circuits 25d each including the high-side-less IGBT driver 48 of FIG. 4 mentioned above as an example.

As shown in FIG. 26, a low breakdown voltage control portion 6 is arranged in the center of a semiconductor chip 1. The low breakdown voltage control portion 6 controls output timing by an input control circuit or the like. Moreover, on the semiconductor chip 1, a plurality of output circuit cells 16D is arranged along chip sides to face each other with the low breakdown voltage control portion 6 interposed therebetween. Each of the plurality of circuit cells 16D has the configuration of the output circuit 25d of FIG. 4. The low breakdown voltage control portion 6 is connected to the output circuit cells 16D via bus interconnects 7. Moreover, high voltage power source pads 4 are arranged on both ends of the plurality of output circuit cells 16D, and reference potential pads 5 are arranged on both the ends of the plurality of output circuit cells 16D.

Each output circuit cell 16D is composed of the pad 8, the low-side transistor 29, the low-side regenerative diode 31, the pre-driver 44, and the ESD protection device 43 which are arranged in alignment with each other along a straight line, wherein centering on the pad 8, the low-side regenerative diode 31, the low-side transistor 29, and the pre-driver 44 are sequentially arranged on one side toward the low breakdown voltage control portion 6, and the ESD protection device 43 is arranged on the other side. It is to be noted that a timing control signal from the low breakdown voltage control portion 6 is transmitted to the pre-drivers 44 through the bus interconnects 7. Moreover, a specific configuration of each output circuit cell 16D is as shown in FIGS. 15A and 15B described above.

As mentioned above, the ESD protection device 43 and the low-side regenerative diode 31 also serving as an ESD protection device in consideration of improving the ESD tolerance are arranged with the pad 8 interposed therebetween. Thus, the effect of ESD protection can be enhanced. Moreover, the pre-driver 44 is designed to have a cell width smaller than or equal to that of the low-side transistor 29, where the low-side transistor 29 has the largest cell width, so that the high integration can be realized.

Moreover, the plurality of output circuit cells 16D is arranged having a steplike shift in a direction apart from the chip sides of the semiconductor chip 1 with decreasing distance from a center portion to the end portions of the chip sides.

Figure 27:
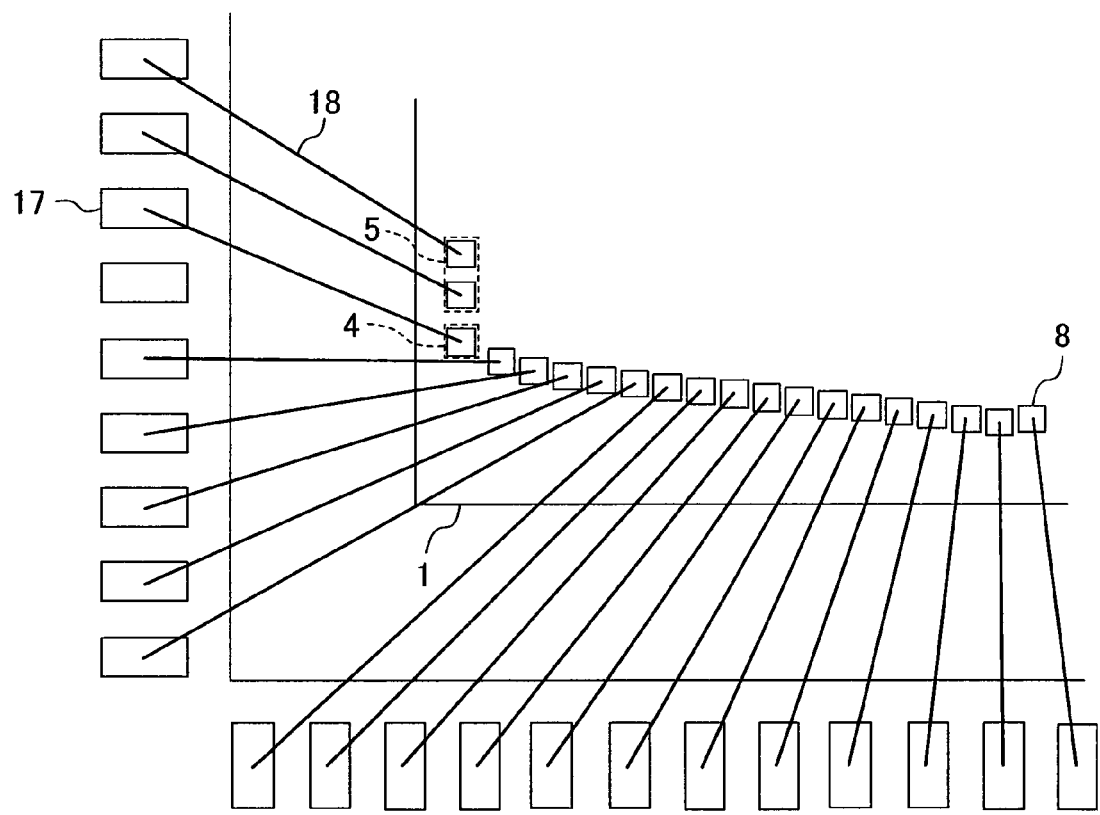
FIG. 27 is a plan view showing how wires are bonded in the semiconductor integrated circuit according to Embodiment 8 of the present invention.

That is, as shown in FIG. 27 which is an enlarged view showing how wires are bonded in the multi-channel semiconductor integrated circuit of the present embodiment, to prevent bonding wires 18 connecting the pads 8 with inner leads 17 from being in contact with each other, the pads 8 in the output circuit cells 16D are arranged having a steplike shift in a direction apart from the chip sides with decreasing distance from the center portion to the end portions of the chip sides.

With this layout, enhancement of reliability as to assembly can be realized. That is, even if the number of output circuit cells 16D or of the inner leads 17 which are to be arranged increases, the bonding wires 18 are prevented from being in contact with each other, so that the reliability as to assembly can be enhanced. Moreover, compared to the conventional example in which pads are arranged with a density variation between output circuit cells (see, for example, FIG. 29), this layout can suppress the increase in chip area in the right and left directions (for example, in the right and left directions when viewed in FIG. 5) caused by wasted space and can effectively use the space on the semiconductor chip 1. Therefore, the integration degree of the semiconductor integrated circuit can be increased.

Moreover, reference potential interconnects 3a are formed such that each of the interconnects 3a lies over the low-side transistors 29 in the output circuit cells 16D and is connected to the reference potential pads 5 arranged on both the ends of the plurality of output circuit cells 16D.

In the same manner, high voltage potential interconnects 2 are formed such that each of the high voltage potential interconnects 2 lies over the ESD protection devices 43 in the output circuit cells 16D and is connected to the high voltage power source pads 4 arranged on both the ends of the plurality of output circuit cells 16D. Here, as described above, the plurality of output circuit cells 16D is arranged having a steplike shift in a direction apart from the chip sides of the semiconductor chip 1 with decreasing distance from the center portion to the end portions of the chip sides. Therefore, by making use of this layout, the width of each high voltage potential interconnect 2 is expanded with decreasing distance from its center portion to end portions so that portions on which a load current from the pads 8 more concentrates are wide. Thus, an interconnect resistance from the center portion of the interconnect 2 to the high voltage source pads 4 can be made uniform. Therefore, a variation in ESD tolerance is suppressed and a variation in ON resistance between outputs due to the difference between voltage drops is reduced, so that output characteristics can be made uniform.

Moreover, since wires are bonded from a package to the reference potential pads 5 and the high voltage power source pads 4 arranged on both the ends of the plurality of output circuit cells 16D on the semiconductor chip 1, potentials of the reference potential pads 5 and the high voltage power source pads 4 are stable. Therefore, it is possible to reduce the interconnect impedance of each of the reference potential interconnects 3a and the high voltage potential interconnects 2. Moreover, even when large currents are output from respective channels, the reference potential and the high voltage potential of each of the output circuit cells 16D are stable, which makes it possible to obtain the output characteristics and the ESD breakdown tolerance which are uniform.

Meanwhile, an input control pad 9 is arranged on one end side in the length direction of the low breakdown control portion 6, and a reference potential pad 5 is arranged on the other end side. Moreover, over the low breakdown voltage control portion 6, a reference potential interconnect 3b is arranged to surround three sides excepting the side where the input control pad 9 is arranged. The reference potential interconnect 3b serves as a shield which prevents an outer noise input from the pads 8 from being transmitted to the low breakdown voltage control portion 6 via the output control cells 16D. Therefore, a signal input from the low breakdown voltage control portion 6 to the pre-drivers 44 is stabilized, which makes the output characteristics uniform. It is to be noted that as the output circuit cells 16D are arranged having a steplike shift in a direction apart from the chip sides of the semiconductor chip 1 with decreasing distance from the center portion to the end portions of the chip sides, the low breakdown voltage control portion 6 is formed to have a slope shift in a direction apart from the chip sides from the center portion toward the end portions of the chip sides.

Moreover, as described above, since the chip area hardly increases in the right and left directions of the semiconductor chip 1, the bus interconnects 7 having a uniform interconnect length can be used to transmit a control signal from the low breakdown voltage control portion 6 to the pre-drivers 44. Therefore, in the present embodiment, the bus interconnects 7 connecting the pre-drives 44 with the low breakdown voltage control portion 6 have substantially the same length. Therefore, the delay times are made uniform to prevent the output characteristics from being unbalanced due to the difference in delay time between output channels.

Variations

Figure 28:
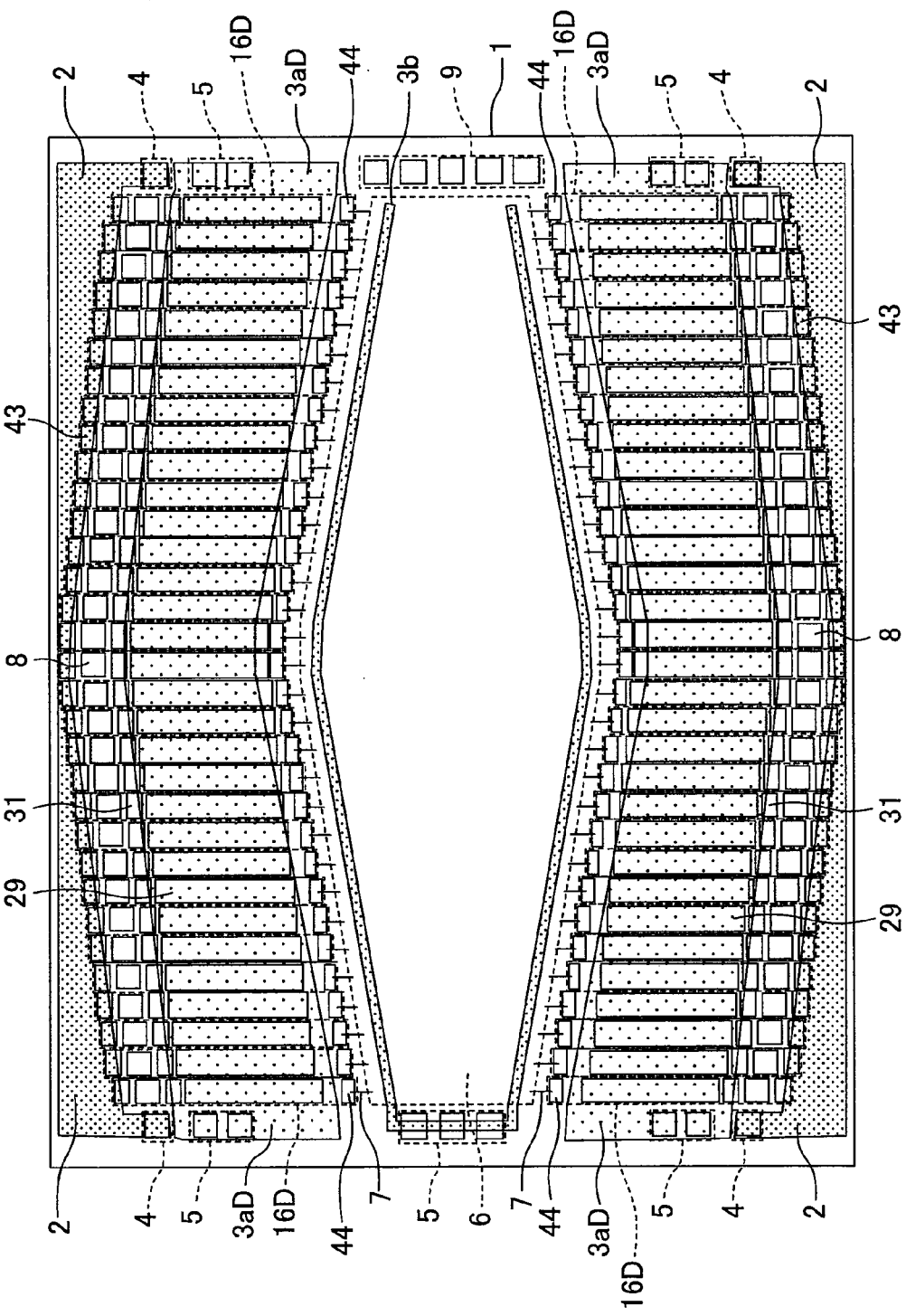
FIG. 28 is a plan view showing a layout of a variation of the semiconductor integrated circuit according to Embodiment 8 of the present invention.

FIG. 28 is a plan view illustrating a layout of a variation of the semiconductor integrated circuit according to Embodiment 8 of the present invention.

As shown in FIG. 28, the variation of the semiconductor integrated circuit according to the present embodiment is characterized by the shape of reference potential interconnects 3aD formed over the low-side transistors 29 in the output circuit cells 16D. Specifically, as the high voltage potential interconnects 2, the width of each reference potential interconnect 3aD is expanded with decreasing distance from the center portion to the end portions of the interconnect 3aD so that portions on which a load current from the pads 8 more concentrates are wide. Thus, an interconnect resistance from the center portion of the interconnect 3aD to the reference potential pads 5 can also be made uniform. Therefore, a variation in ESD tolerance is suppressed and a variation in ON resistance between outputs due to the difference between voltage drops is reduced, so that output characteristics can be made uniform.

In FIG. 28, descriptions have been given of the configuration in which the width of each reference potential interconnect 3aD as well as the width of each high voltage potential interconnect 2 are expanded with decreasing distance from the center portion to the end portions. However, a configuration may be acceptable in which the width of each high voltage potential interconnect 2 is constant, and only the width of each reference potential interconnect 3aD is formed to have the above-mentioned shape.

Note that, in the Embodiments above, the term "reference potential" is used to include not only ground potentials but also potentials other than the ground potential. However, the term "reference potential" indicates a potential applied to a substrate of a semiconductor chip and usually means ground potential.

INDUSTRIAL APPLICABILITY

The present invention is applicable to a multi-channel semiconductor integrated circuit for driving a capacitive load, for example, PDP.

The invention claimed is:

1. A semiconductor integrated circuit including a plurality of circuit cells on a semiconductor chip, the plurality of circuit cells being formed along a first chip side of the semiconductor chip and each of the plurality of circuit cells having a pad, wherein:

among the plurality of circuit cells, two or more circuit cells having the same size in the vicinity of at least an end portion of the first chip side are arranged having a steplike shift in a direction apart from the first chip side with decreasing distance from a center portion to the end portion of the first chip side, each of the circuit cells includes:

a voltage driver including a MOS transistor or an IGBT transistor;
a pre-driver for driving the voltage driver; and
the pad,
the voltage driver includes a high-side transistor and a low-side transistor, and
the pre-driver includes a level shift circuit for driving the high-side transistor.

2. The semiconductor integrated circuit of claim 1, wherein the plurality of circuit cells are arranged having a steplike shift in a direction apart from the first chip side with decreasing distance from the center portion to the end portion of the first chip side.

3. The semiconductor integrated circuit of claim 1, wherein the pre-driver, the pad, the high-side transistor, the level shift circuit, and the low-side transistor are arranged in alignment with each other along a straight line.

4. The semiconductor integrated circuit of claim 3, wherein at least the high-side transistor and the low-side transistor are arranged to face each other with the pad interposed therebetween.

5. The semiconductor integrated circuit of claim 4, further comprising:
a control portion arranged in the center of the semiconductor chip; and
a second circuit cell alignment of the plurality of circuit cells arranged along a second chip side facing the first chip side of the semiconductor chip, the second circuit cell alignment facing a first circuit cell alignment of the plurality of circuit cells arranged along the first chip side of the semiconductor chip with the control portion interposed therebetween.

6. The semiconductor integrated circuit of claim 5, further comprising:
first power source pads for a high voltage potential, the first power source pads being arranged on both ends of each of the first circuit cell alignment and the second circuit cell alignment;
second power source pads for a reference potential, the second power source pads being arranged on both the ends of each of the first circuit cell alignment and the second circuit cell alignment;
first interconnects for the high voltage potential, the first interconnects being arranged over the high-side transistors in the first circuit cell alignment and the second circuit cell alignment and being electrically connected to the first power source pads; and
second interconnects for the reference potential, the second interconnects being arranged over the low-side transistors in the first circuit cell alignment and the second circuit cell alignment and being electrically connected to the second power source pads.

7. The semiconductor integrated circuit of claim 6, wherein at least either of the first interconnects and the second interconnects have a width expanding from a center portion to an end portion in the length direction.

8. The semiconductor integrated circuit of claim 5, further comprising a third interconnect for a reference potential, the third interconnect surrounding the control portion arranged in the center of the semiconductor chip.

9. The semiconductor integrated circuit of claim 5, further comprising a plurality of fourth interconnects for connecting the control portion to the pre-drivers included in at least one of the first circuit cell alignment and the second circuit cell alignment, the plurality of fourth interconnects having a uniform interconnect length.

10. The semiconductor integrated circuit of claim 1, wherein each of the level shift circuit and the pre-driver is designed to have a cell width smaller than or equal to that of the low-side transistor.

11. A semiconductor integrated circuit including a plurality of circuit cells on a semiconductor chip, the plurality of circuit cells being formed along a first chip side of the semiconductor chip and each of the plurality of circuit cells having a pad, wherein:
among the plurality of circuit cells, two or more circuit cells having the same size in the vicinity of at least an end portion of the first chip side are arranged having a steplike shift in a direction apart from the first chip side with decreasing distance from a center portion to the end portion of the first chip side,
each of the circuit cells includes:
a voltage driver including a MOS transistor or an IGBT transistor;
a pre-driver for driving the voltage driver; and
the pad, and
the voltage driver includes:
a high-side transistor;
a high-side regenerative diode;
a low-side transistor; and
a low-side regenerative diode.

12. The semiconductor integrated circuit of claim 11, wherein the pre-driver, the pad, the high-side transistor, the level shift circuit, the high-side regenerative diode, the low-side transistor, and the low-side regenerative diode are arranged in alignment with each other along a straight line.

13. The semiconductor integrated circuit of claim 12, wherein at least the high-side regenerative diode and the low-side regenerative diode are arranged to face each other with the pad interposed therebetween.

14. The semiconductor integrated circuit of claim 13, further comprising:
a control portion arranged in the center of the semiconductor chip; and
a second circuit cell alignment of the plurality of circuit cells arranged along a second chip side facing the first chip side of the semiconductor chip, the second circuit cell alignment facing a first circuit cell alignment of the plurality of circuit cells arranged along the first chip side of the semiconductor chip with the control portion interposed therebetween.

15. The semiconductor integrated circuit of claim 14, further comprising:
first power source pads for a high voltage potential, the first power source pads being arranged on both ends of each of the first circuit cell alignment and the second circuit cell alignment;
second power source pads for a reference potential, the second power source pads being arranged on both the ends of each of the first circuit cell alignment and the second circuit cell alignment;
first interconnects for the high voltage potential, the first interconnects being arranged over the high-side regenerative diodes in the first circuit cell alignment and the second circuit cell alignment and being electrically connected to the first power source pads; and
second interconnects for the reference potential, the second interconnects being arranged over the low-side transistors in the first circuit cell alignment and the second circuit cell alignment and being electrically connected to the second power source pads.

16. The semiconductor integrated circuit of claim 15, wherein at least either of the first interconnects and the second interconnects have a width expanding from a center portion to an end portion in the length direction.

17. The semiconductor integrated circuit of claim 14, further comprising a third interconnect for a reference potential, the third interconnect surrounding the control portion arranged in the center of the semiconductor chip.

18. The semiconductor integrated circuit of claim 14, further comprising a plurality of fourth interconnects for connecting the control portion to the pre-drivers included in at least one of the first circuit cell alignment and the second circuit cell alignment, the plurality of fourth interconnects having a uniform interconnect length.

19. The semiconductor integrated circuit of claim 11, wherein each of the level shift circuit and the pre-driver is designed to have a cell width smaller than or equal to that of the low-side transistor.

20. A semiconductor integrated circuit including a plurality of circuit cells on a semiconductor chip, the plurality of circuit cells being formed along a first chip side of the semiconductor chip and each of the plurality of circuit cells having a pad, wherein:
among the plurality of circuit cells, two or more circuit cells having the same size in the vicinity of at least an end portion of the first chip side are arranged having a step-like shift in a direction apart from the first chip side with decreasing distance from a center portion to the end portion of the first chip side,
each of the circuit cells includes:
a voltage driver including a MOS transistor or an IGBT transistor;
a pre-driver for driving the voltage driver; and
the pad, and
the voltage driver includes:
an ESD protection device; and
a low-side transistor.

21. The semiconductor integrated circuit of claim 20, wherein the pre-driver, the pad, the ESD protection device, and the low-side transistor are arranged in alignment with each other along a straight line.

22. The semiconductor integrated circuit of claim 21, wherein at least the ESD protection device and the low-side transistor are arranged to face each other with the pad interposed therebetween.

23. The semiconductor integrated circuit of claim 22 further comprising:
a control portion arranged in the center of the semiconductor chip; and
a second circuit cell alignment of the plurality of circuit cells arranged along a second chip side facing the first chip side of the semiconductor chip, the second circuit cell alignment facing a first circuit cell alignment of the plurality of circuit cells arranged along the first chip side of the semiconductor chip with the control portion interposed therebetween.

24. The semiconductor integrated circuit of claim 23, further comprising:
first power source pads for a high voltage potential, the first power source pads being arranged on both ends of each of the first circuit cell alignment and the second circuit cell alignment;
second power source pads for a reference potential, the second power source pads being arranged on both the ends of each of the first circuit cell alignment and the second circuit cell alignment;
first interconnects for the high voltage potential, the first interconnects being arranged over the ESD protection devices in the first circuit cell alignment and the second circuit cell alignment and being electrically connected to the first power source pads; and
second interconnects for the reference potential, the second interconnects being arranged over the low-side transistors in the first circuit cell alignment and the second circuit cell alignment and being electrically connected to the second power source pads.

25. The semiconductor integrated circuit of claim 24, wherein at least either of the first interconnects and the second interconnects have a width expanding from a center portion to an end portion in the length direction.

26. The semiconductor integrated circuit of claim 23, further comprising a third interconnect for a reference potential, the third interconnect surrounding the control portion arranged in the center of the semiconductor chip.

27. The semiconductor integrated circuit of claim 23, further comprising a plurality of fourth interconnects for connecting the control portion to the pre-drivers included in at least one of the first circuit cell alignment and the second circuit cell alignment, the plurality of fourth interconnects having a uniform interconnect length.

28. The semiconductor integrated circuit of claim 20, wherein the pre-driver is designed to have a cell width smaller than or equal to that of the low-side transistor.

29. A semiconductor integrated circuit including a plurality of circuit cells on a semiconductor chip, the plurality of circuit cells being formed along a first chip side of the semiconductor chip and each of the plurality of circuit cells having a pad, wherein:
among the plurality of circuit cells, two or more circuit cells having the same size in the vicinity of at least an end portion of the first chip side are arranged having a step-like shift in a direction apart from the first chip side with decreasing distance from a center portion to the end portion of the first chip side,
each of the circuit cells includes:
a voltage driver including a MOS transistor or an IGBT transistor;
a pre-driver for driving the voltage driver; and
the pad, and
the voltage driver includes:
an ESD protection device;
a low-side regenerative diode; and
a low-side transistor.

30. The semiconductor integrated circuit of claim 29, wherein the pre-driver, the pad, the ESD protection device, the low-side regenerative diode, and the low-side transistor are arranged in alignment with each other along a straight line.

31. The semiconductor integrated circuit of claim 30, wherein at least the ESD protection device and the low-side regenerative diode are arranged to face each other with the pad interposed therebetween.

32. The semiconductor integrated circuit of claim 31 further comprising:
a control portion arranged in the center of the semiconductor chip; and
a second circuit cell alignment of the plurality of circuit cells arranged along a second chip side facing the first chip side of the semiconductor chip, the second circuit cell alignment facing a first circuit cell alignment of the plurality of circuit cells along the first chip side of the semiconductor chip with the control portion interposed therebetween.

33. The semiconductor integrated circuit of claim 32, further comprising:

first power source pads for a high voltage potential, the first power source pads being arranged on both ends of each of the first circuit cell alignment and the second circuit cell alignment;

second power source pads for a reference potential, the second power source pads being arranged on both the ends of each of the first circuit cell alignment and the second circuit cell alignment;

first interconnects for the high voltage potential, the first interconnects being arranged over the ESD protection devices in the first circuit cell alignment and the second circuit cell alignment and being electrically connected to the first power source pads; and second interconnects for the reference potential, the second interconnects being arranged over the low-side transistors in the first circuit cell alignment and the second circuit cell alignment and being electrically connected to the second power source pads.

34. The semiconductor integrated circuit of claim 33, wherein at least either of the first interconnects and the second interconnects have a width expanding from a center portion to an end portion in the length direction.

35. The semiconductor integrated circuit of claim 32, further comprising a third interconnect for a reference potential, the third interconnect surrounding the control portion arranged in the center of the semiconductor chip.

36. The semiconductor integrated circuit of claim 32, further comprising a plurality of fourth interconnects for connecting the control portion to the pre-drivers included in at least one of the first circuit cell alignment and the second circuit cell alignment, the plurality of fourth interconnects having a uniform interconnect length.

37. The semiconductor integrated circuit of claim 29, wherein the pre-driver is designed to have a cell width smaller than or equal to that of the low-side transistor.

* * * * *